US011450673B2

(12) United States Patent
Yang et al.

(10) Patent No.: US 11,450,673 B2
(45) Date of Patent: Sep. 20, 2022

(54) CONNECTION BETWEEN SOURCE/DRAIN AND GATE

(71) Applicant: Taiwan Semiconductor Manufacturing Co., Ltd., Hsin-Chu (TW)

(72) Inventors: Chih-Chuan Yang, Hsinchu (TW); Chia-Hao Pao, Hsinchu (TW); Yu-Kuan Lin, Taipei (TW); Lien Jung Hung, Hsinchu (TW); Ping-Wei Wang, Hsin-Chu (TW); Shih-Hao Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 15 days.

(21) Appl. No.: 16/945,146

(22) Filed: Jul. 31, 2020

(65) Prior Publication Data

US 2022/0037340 A1 Feb. 3, 2022

(51) Int. Cl.
*H01L 29/06* (2006.01)
*H01L 29/10* (2006.01)
*H01L 29/423* (2006.01)
*H01L 27/11* (2006.01)
*H01L 21/02* (2006.01)
*H01L 21/8238* (2006.01)
*H01L 27/092* (2006.01)
*H01L 29/66* (2006.01)
*H01L 29/786* (2006.01)

(52) U.S. Cl.
CPC ...... *H01L 27/1108* (2013.01); *H01L 21/0214* (2013.01); *H01L 21/0217* (2013.01); *H01L 21/02126* (2013.01); *H01L 21/02164* (2013.01); *H01L 21/02167* (2013.01); *H01L 21/02271* (2013.01); *H01L 21/02532* (2013.01); *H01L 21/02603* (2013.01); *H01L 21/823807* (2013.01); *H01L 21/823814* (2013.01); *H01L 21/823864* (2013.01); *H01L 21/823878* (2013.01); *H01L 27/092* (2013.01); *H01L 29/0649* (2013.01); *H01L 29/0673* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78618* (2013.01); *H01L 29/78696* (2013.01)

(58) Field of Classification Search
CPC ............. H01L 29/42392; H01L 23/535; H01L 29/66772; H01L 29/16; H01L 29/78684
See application file for complete search history.

(56) References Cited

U.S. PATENT DOCUMENTS 9,818,872 B2 11/2017 Ching et al.
9,887,269 B2 2/2018 Ching et al.
9,899,398 B1 2/2018 Colinge et al.
(Continued)

*Primary Examiner* — Brian Turner
(74) *Attorney, Agent, or Firm* — Haynes and Boone, LLP

(57) ABSTRACT

A semiconductor device according to the present disclosure includes a gate extension structure, a first source/drain feature and a second source/drain feature, a vertical stack of channel members extending between the first source/drain feature and the second source/drain feature along a direction, and a gate structure wrapping around each of the vertical stack of channel members. The gate extension structure is in direct contact with the first source/drain feature.

19 Claims, 28 Drawing Sheets

(56) References Cited

U.S. PATENT DOCUMENTS

| | | |
|---|---|---|
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 10,840,146 B1* | 11/2020 | Paul ................ H01L 29/0673 |
| 2013/0256767 A1* | 10/2013 | Pradhan ........... H01L 29/66666 |
| | | 438/270 |
| 2017/0213888 A1* | 7/2017 | Chang .............. H01L 29/66795 |
| 2018/0040695 A1* | 2/2018 | Smith ............. H01L 21/823871 |
| 2018/0175036 A1 | 6/2018 | Ching et al. |
| 2020/0075720 A1* | 3/2020 | Cheng .............. H01L 29/66553 |
| 2021/0119021 A1* | 4/2021 | Colombeau ....... H01L 29/66522 |

* cited by examiner

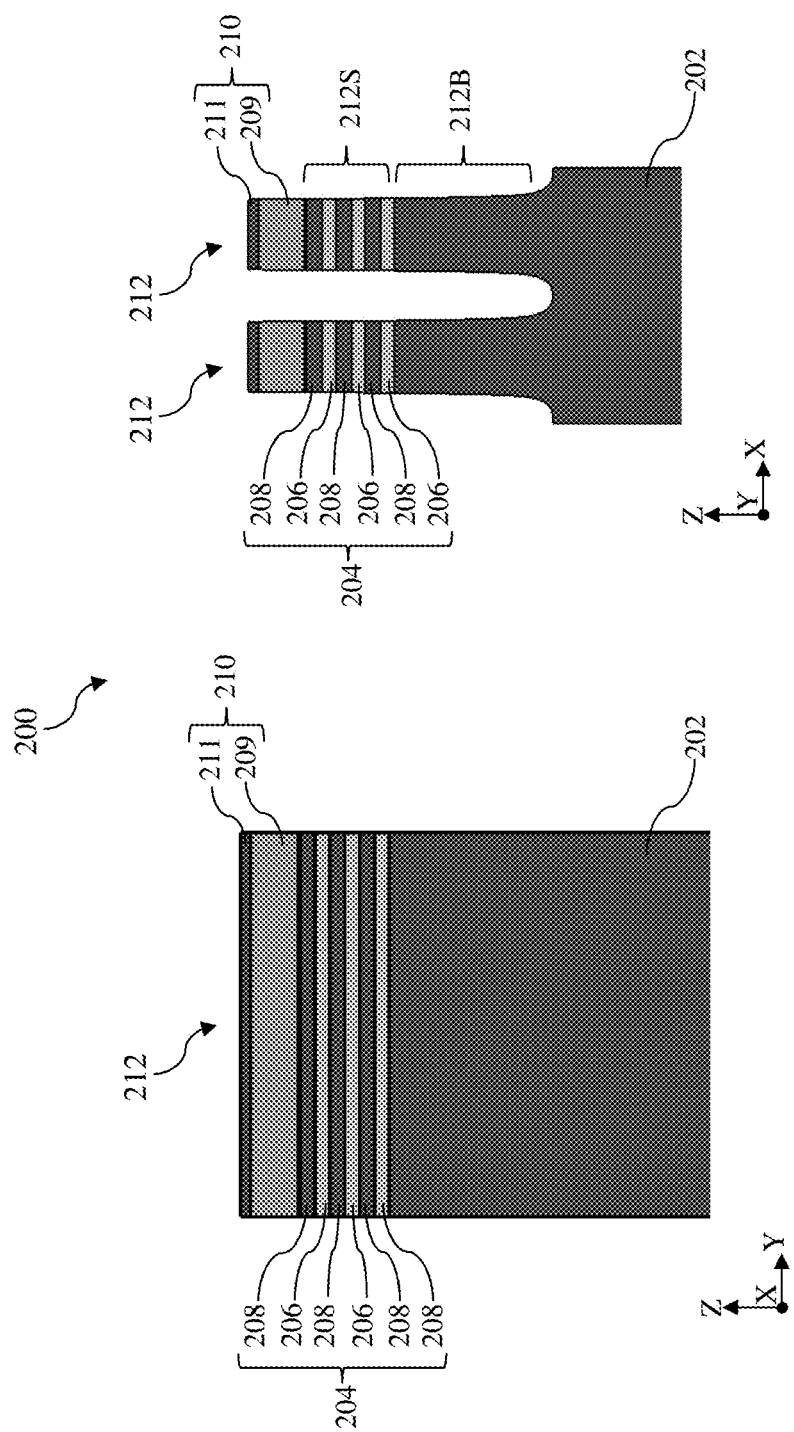

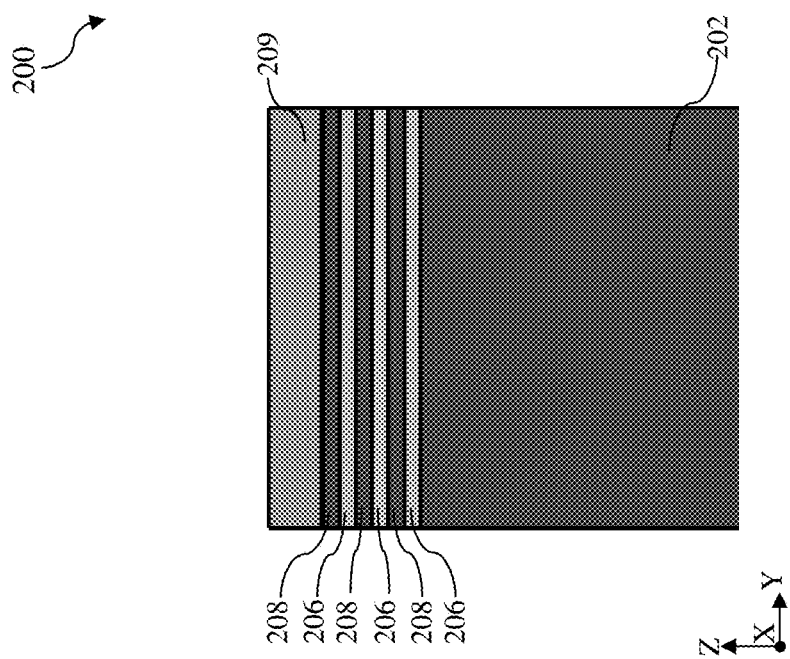
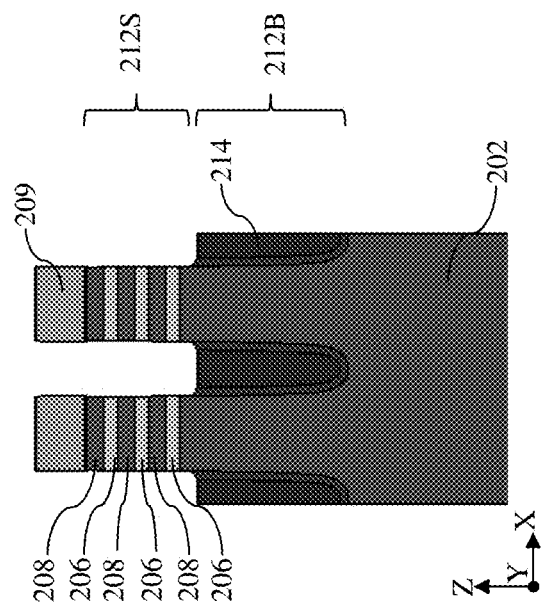
Fig. 5B
Fig. 5C

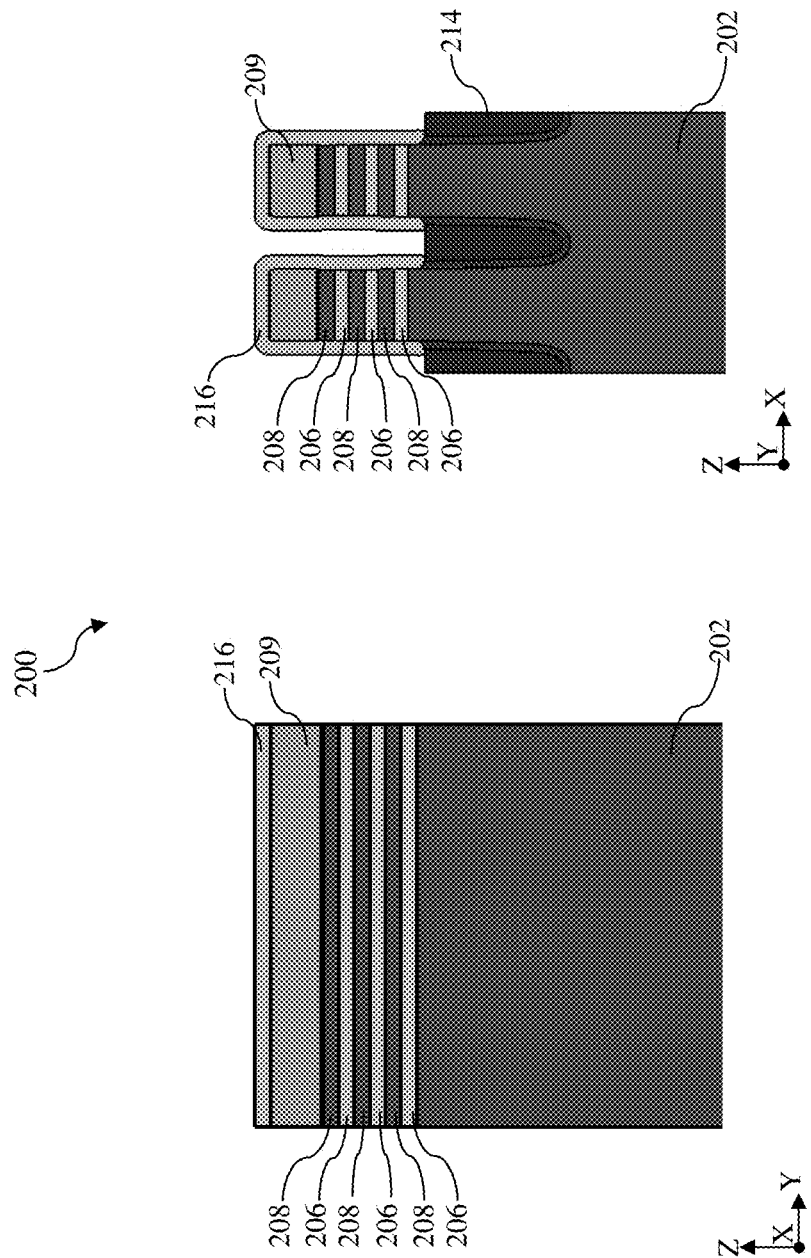

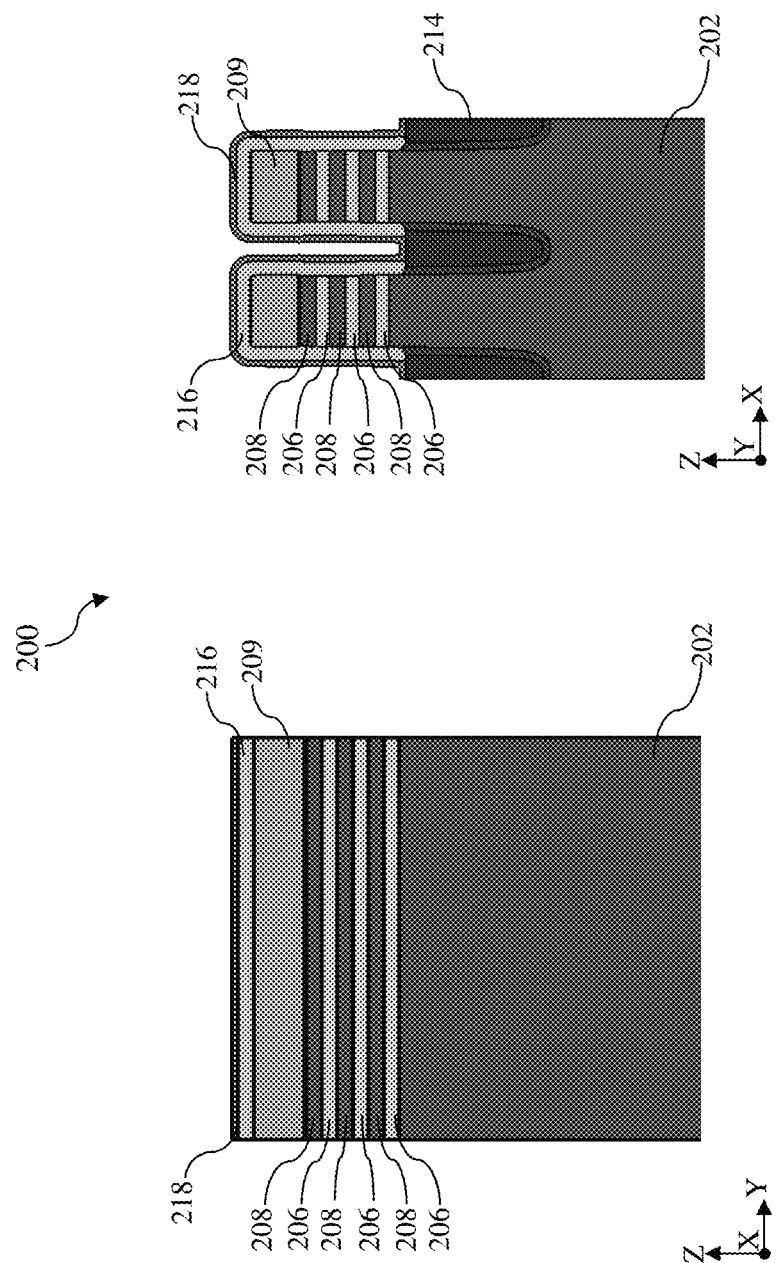

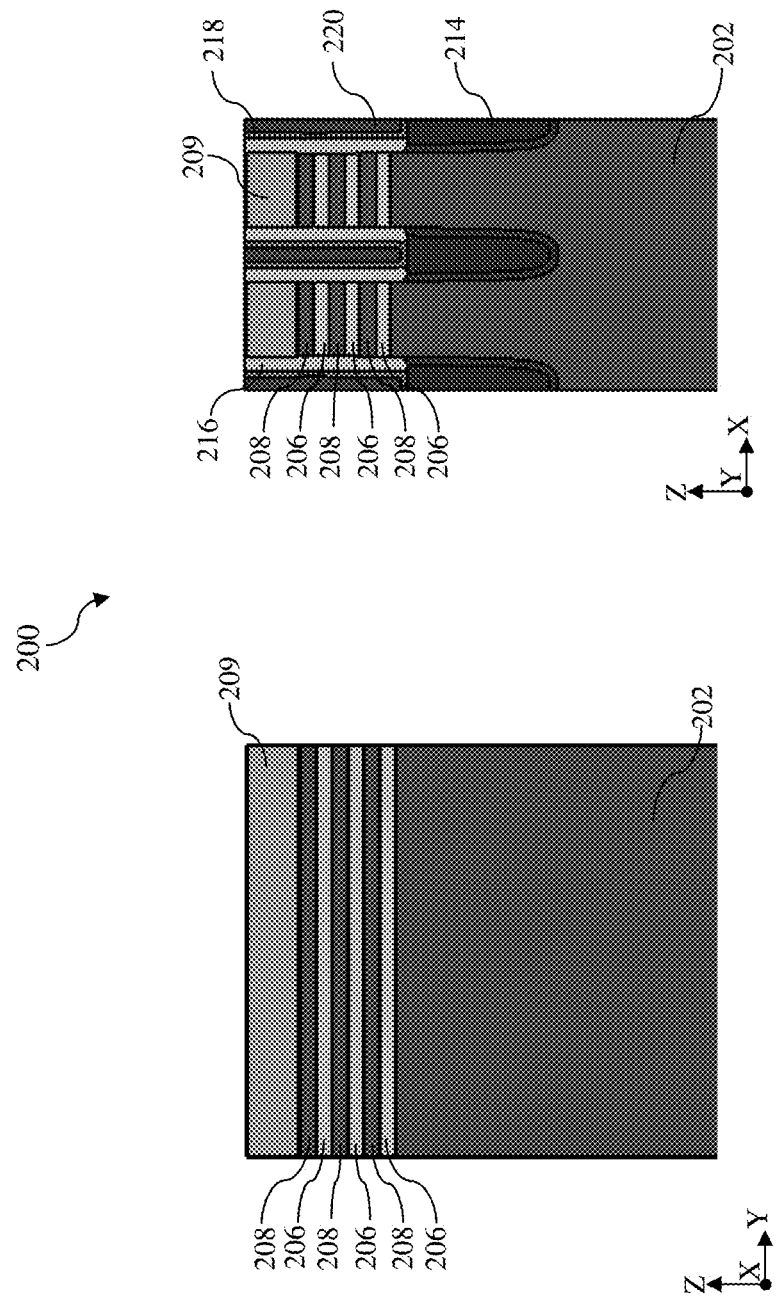

CONNECTION BETWEEN SOURCE/DRAIN AND GATE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

In some IC circuits where multi-gate devices are implemented, a connection between a gate structure and a source/drain feature may be realized by various contact structures. For example, a gate contact to the gate structure may be coupled to a source/drain contact to the source/drain feature via a butted contact. A butted contact is not self-aligned and requires additional lithography steps, which may translate into increased cost. Additionally, a butted contact may take up space in a metal line layer and impact routing. Therefore, while conventional gate-to-source/drain connections are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2D, and 3A-9A illustrate fragmentary perspective views of a workpiece during various fabrication stages in the method of FIG. 1, according to one or more aspects of the present disclosure.

FIGS. 2B-16B and 2C-9C illustrate fragmentary cross-sectional views of a workpiece during various fabrication stages in the method of FIG. 1, according to one or more aspects of the present disclosure.

DETAILED DESCRIPTION

Figure 1:
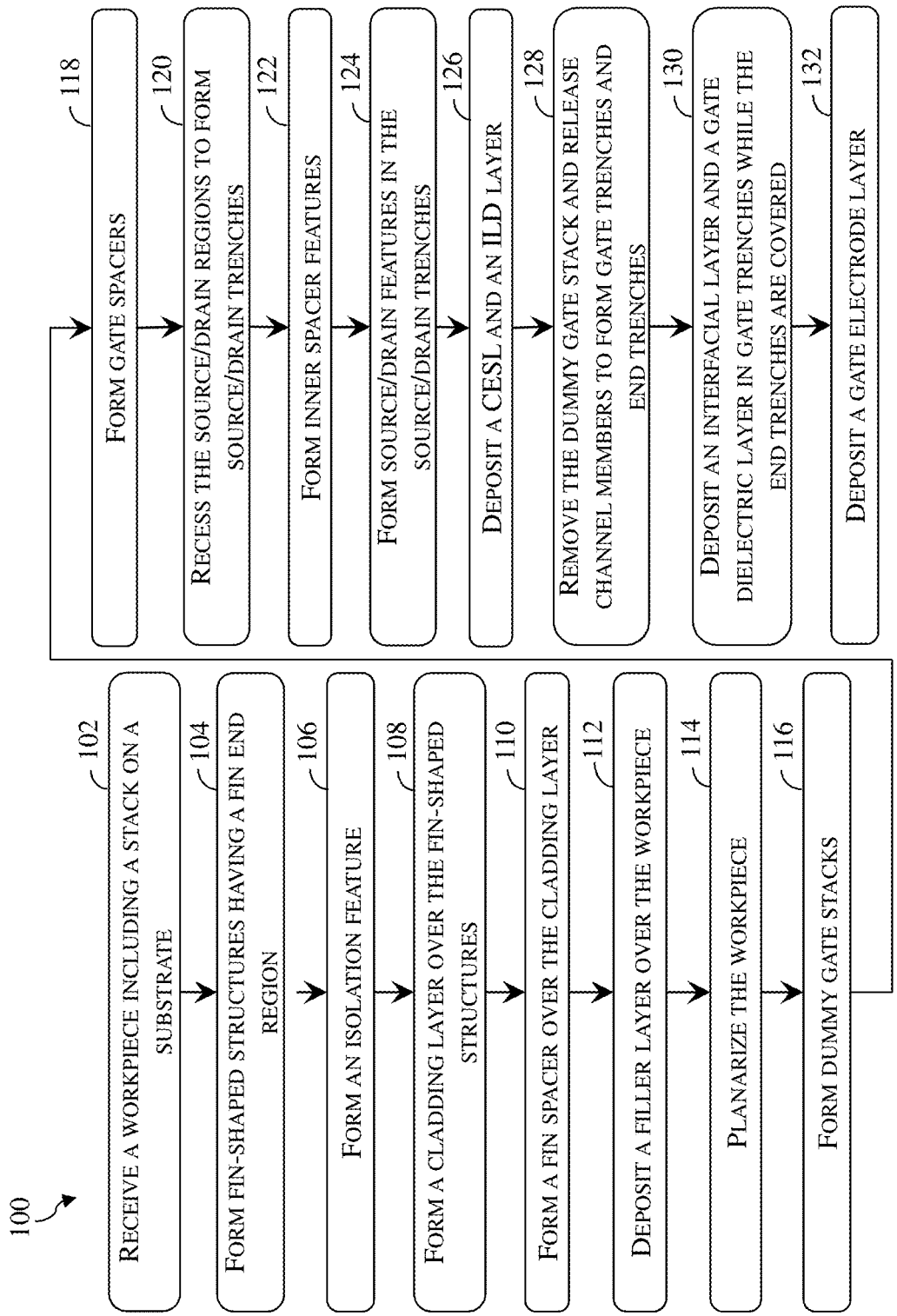
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to a contact structure among multi-gate devices, and more particularly to a connection between a gate structure and a source/drain feature.

IC manufacturing process flow may be typically divided into three categories: front-end-of-line (FEOL) processes, middle-end-of-line (MEOL) processes, and back-end-of-line (BEOL) processes. FEOL processes generally encompasses processes related to fabricating IC devices, such as transistors. For example, FEOL processes may include forming isolation features, gate structures, and source/drain features. MEOL processes generally encompasses processes related to fabricating contacts to conductive features of the IC devices, such as contacts to the gate structures and/or the source/drain features. BEOL processes generally encompasses processes related to fabricating a multilayer interconnect (MLI) feature that interconnects IC features fabricated by FEOL and MEOL process, thereby enabling operation of the IC devices. Features fabricated by FEOL processes may be referred to as FEOL features. Features fabricated by MEOL processes may be referred to as MEOL features. Features fabricated by BEOL processes may be referred to as BEOL features.

Some IC devices include a connection between FEOL structures. For example, some static random access memory (SRAM) cells include a connection between a source/drain feature of one transistor to a gate structure of another transistor. Due to lack of FEOL contact structures, MEOL or even BEOL contact features, such as butted contacts, are fabricated to achieve such a connection. Such MEOL or BEOL contact features may require additional photolithography processes and may increase the cost of manufacturing.

The present disclosure provides a semiconductor structure that includes an FEOL contact structure to connect a source/drain feature of one transistor to a gate structure of another transistor. In some embodiments, a cladding layer is deposited over a fin-shaped structure that includes a base portion formed from a substrate and a stack portion formed from a stack of channel layers interleaved by sacrificial layers. The fin-shaped structure may undergo fin cut process and may include an end surface. The cladding layer is also deposited over the end surface of the fin-shaped structure. After the formation of the inner spacer features, formation of source/drain features, release of channel layers from the sacrificial layers to form channel members, and removal of the cladding layer along the end surface, portions of a source/drain feature may be exposed from the end surface. Because the cladding layer is formed of a material that may be selectively etched relative to the channel members, the exposure of the source/drain features from the end surfaces is self-aligned. A gate electrode layer is then deposited on the exposed portions of the source/drain feature to be electrically coupled to the source/drain feature. This connection feature of the present disclosure, which is formed at the FEOL level, may eliminated the need to form MEOL or even BEOL contact structures to connect the gate structure and the source/drain feature.

The various aspects of the present disclosure will now be described in more detail with reference to the figures. FIG. 1 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 2A-9A, 2B-16B, 2C-9C, and 2D, which illustrate fragmentary perspective or cross-sectional views of a workpiece 200 at different stages of fabrication according to embodiments of method 100. To illustrate various aspects of the device and method embodiments, figures ending with a letter "A" illustrate fragmentary perspective views of the workpiece 200, figures ending with a letter "B" illustrate fragmentary cross-sectional views along the X direction, figures ending with a letter "C" illustrate fragmentary cross-sectional views along the Y direction. Additionally, FIG. 2D also illustrates a fragmentary perspective view of a different segment of the workpiece 200. Because a semiconductor device will be formed from the workpiece 200, the workpiece 200 may be referred to as a semiconductor device 200 as the context requires. Although embodiments that include MBC transistors are illustrated in the figures, the present disclosure is not so limited and may be applicable to other multi-gate devices. As described above, MBC transistors may also be referred to as SGTs, GAA transistors, nanosheet transistors, or nanowire transistors.

Figure 2A:
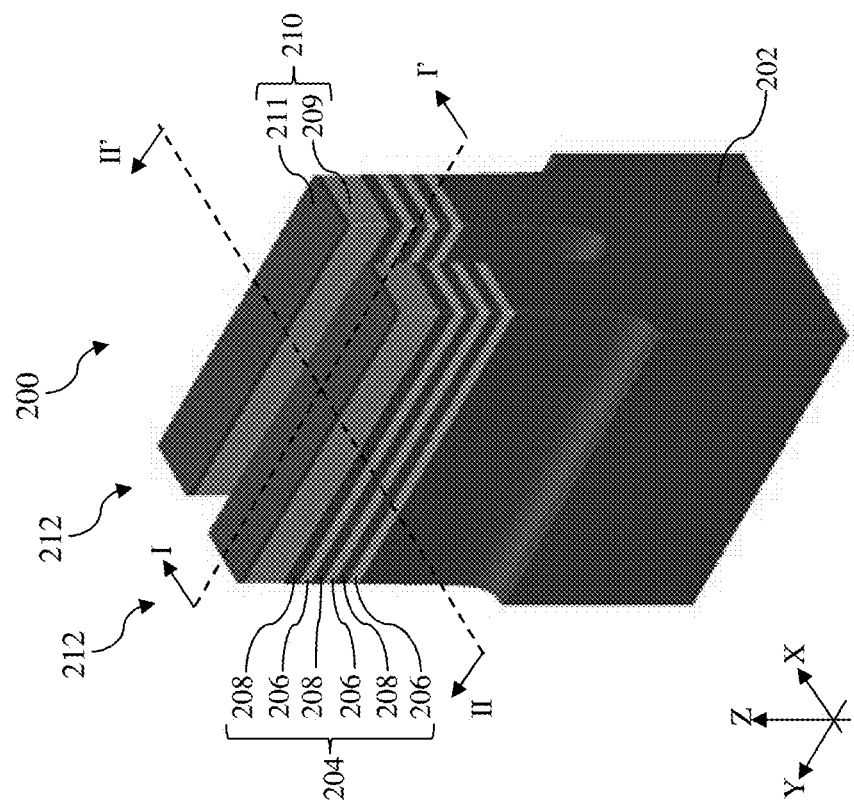

Referring to FIGS. 1 and 2A-2C, method 100 includes a block 102 where a workpiece 200 is received. As shown in FIGS. 2A, 2B and 2C, the workpiece 200 includes a substrate 202 and a stack 204 disposed on the substrate 202. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

Referring still to FIGS. 2A, 2B and 2C, the stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. It is noted that three (3) layers of the sacrificial layers 206 and three (3) layers of the channel layers 208 are alternately and vertically arranged as illustrated in FIGS. 2A, 2B and 2C, which are for illustrative purposes only and not intended to be limiting beyond what is specifically recited in the claims. The number of layers depends on the desired number of channels members for the semiconductor device 200. In some embodiments, the number of the channel layers 208 is between 2 and 10. For patterning purposes, the workpiece 200 may also include a hard mask layer 210 over the stack 204. The hard mask layer 210 may be a single layer or a multilayer. In one example, the hard mask layer 210 is a multi-layer and includes a first layer 209 and a second layer 211 over the first layer 209. In some embodiments, the first layer 209 is formed of silicon nitride and the second layer 211 is formed of silicon oxide. In some alternative embodiments, the first layer is formed of silicon germanium (SiGe) and the second layer is formed of silicon (Si).

Referring to FIGS. 1, 2A, 2B, 2C, and 2D, method 100 includes a block 104 where fin-shaped structure 212 are formed. As shown in FIGS. 2A, 2B and 2C, each of the fin-shaped structures 212 includes a base portion 212B formed from a portion of the substrate 202 and a stack portion 212S formed from the stack 204. The stack portion 212S is disposed over the base portion 212B. In some embodiments, at block 104, the stack 204 and the substrate 202 are patterned to form the fin-shaped structures 212. The fin-shaped structures 212 extend lengthwise along the Y direction and extend vertically along the Z direction from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structures 212 by etching the stack 204 and the substrate 202. The etching process can include dry etching, wet etching, reactive ion etching (RIE), and/or other suitable processes.

Figure 2D:
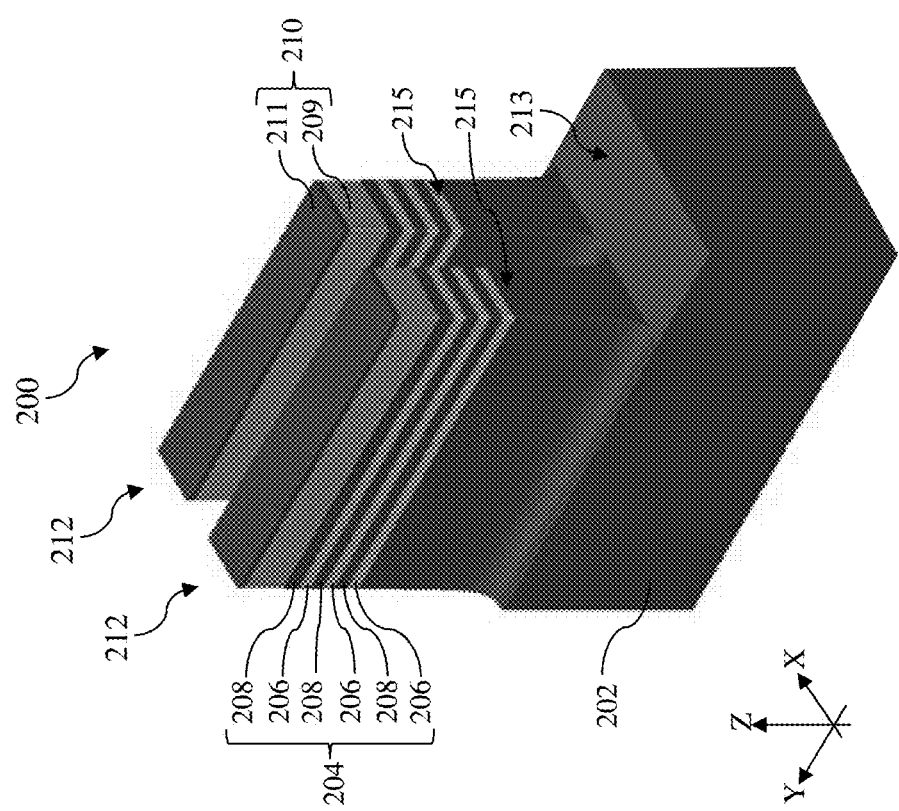

In some embodiments, the fin-shaped structures 212 may be segmented by a fin cut process to form a fin cut opening 213, as shown in FIG. 2D. Each of the fin-shaped structures 212 has an end surface 215 exposed in the fin cut opening 213. Additional surfaces of the substrate 202 may also be exposed in the fin cut opening 213. The end surface 215 may also be referred to as the end sidewall 215. It is noted that, unless a mask is used, a subsequent conformal or blanket deposition of material may result in the material being deposited in the fin cut opening 213 and over the end surface 215.

Figure 3A:
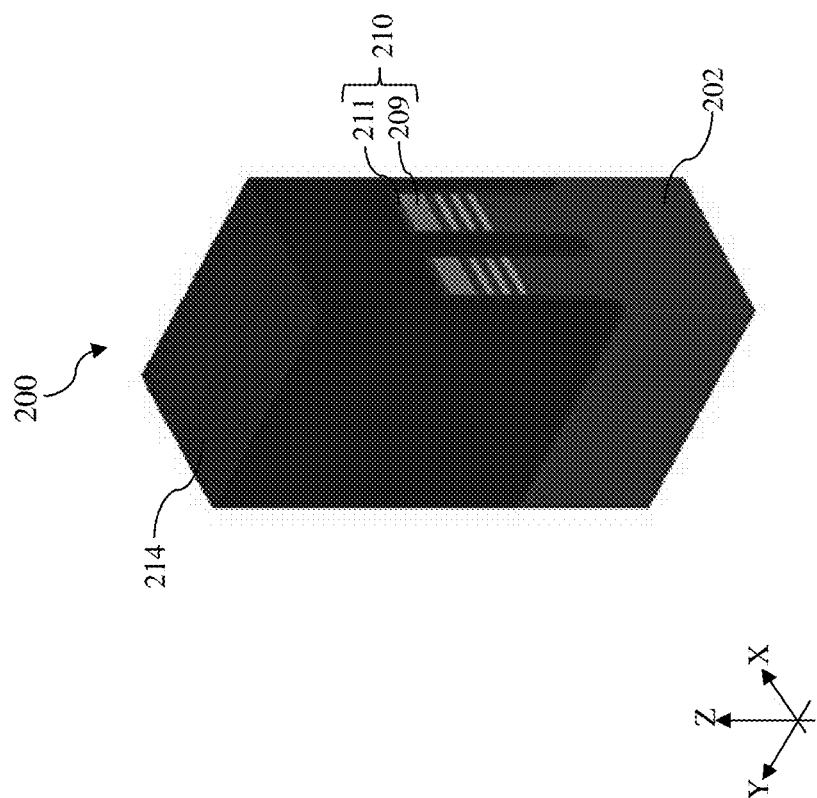
Figure 3C:
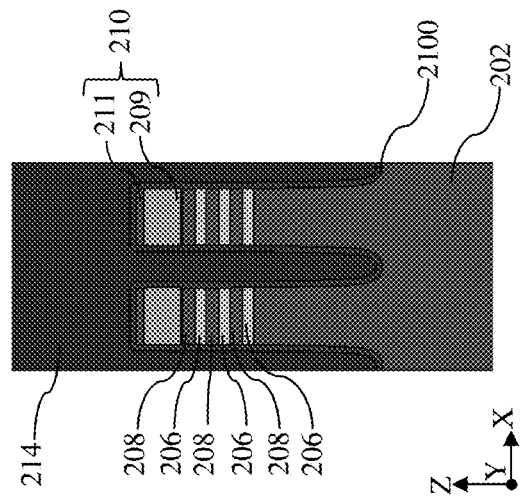
Figure 3B:
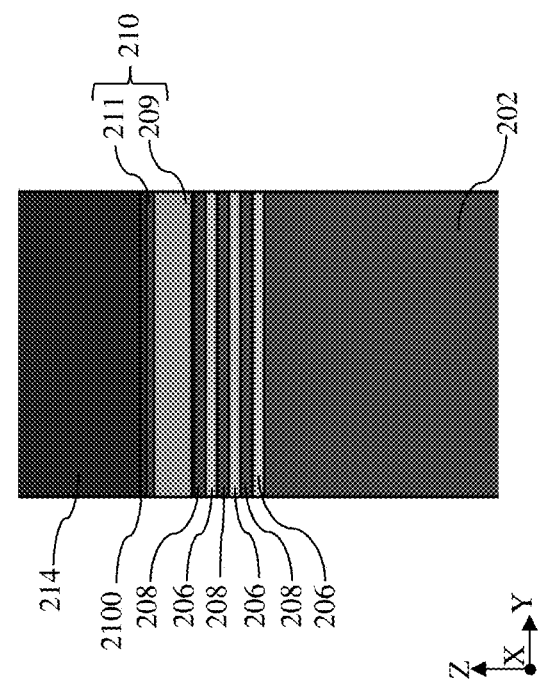
Figure 4A:
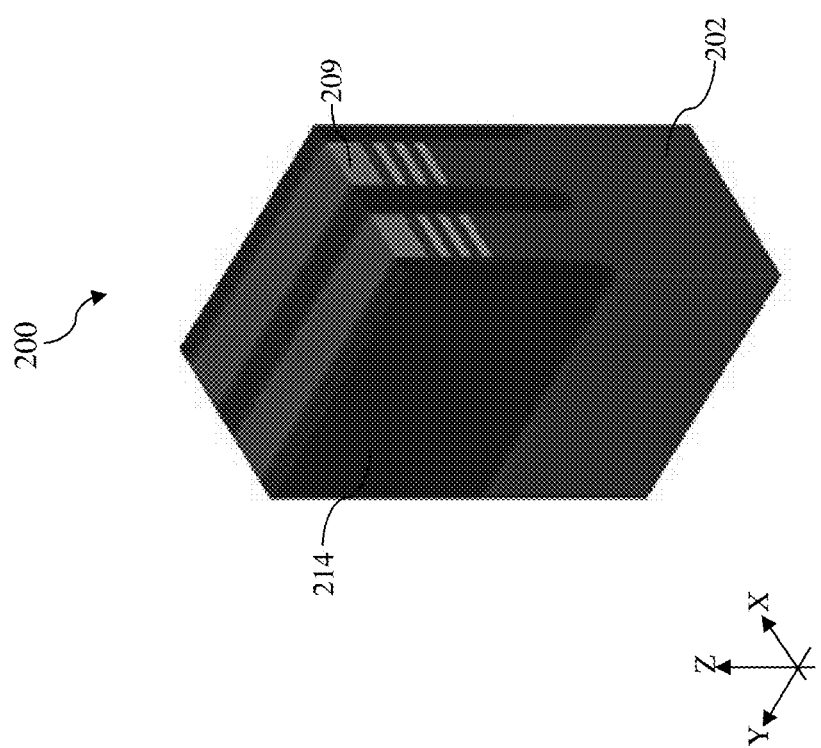
Figure 4C:
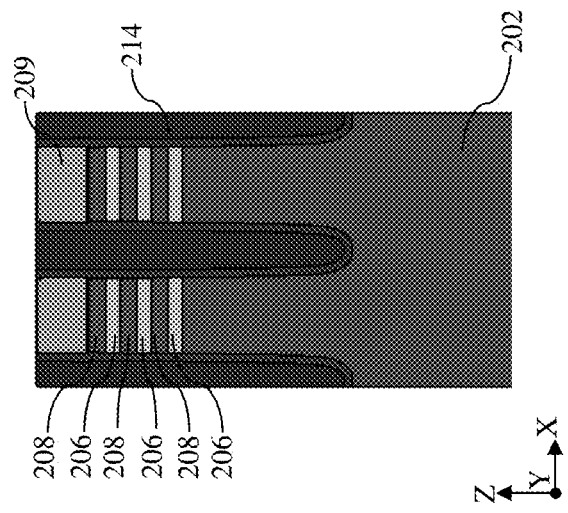
Figure 4B:
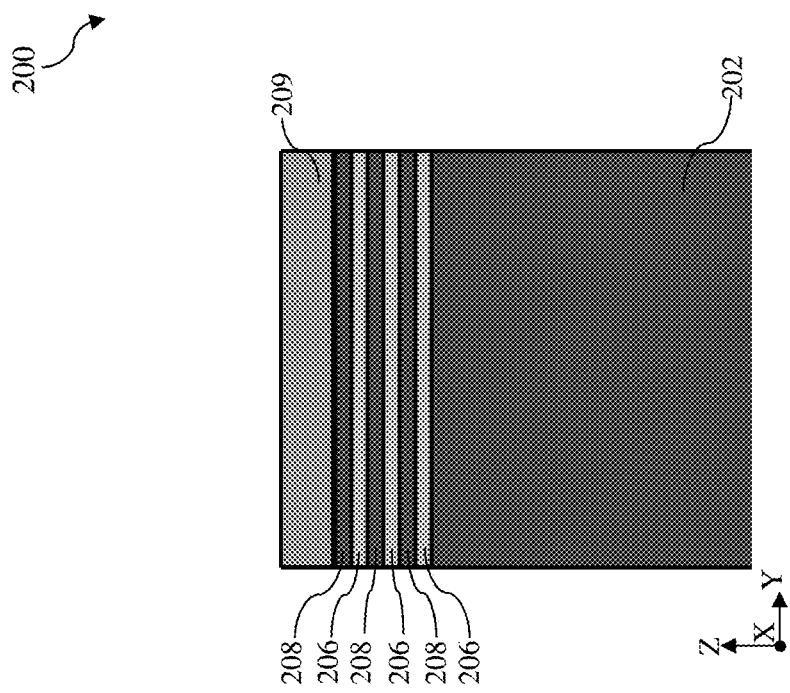
Figure 5A:
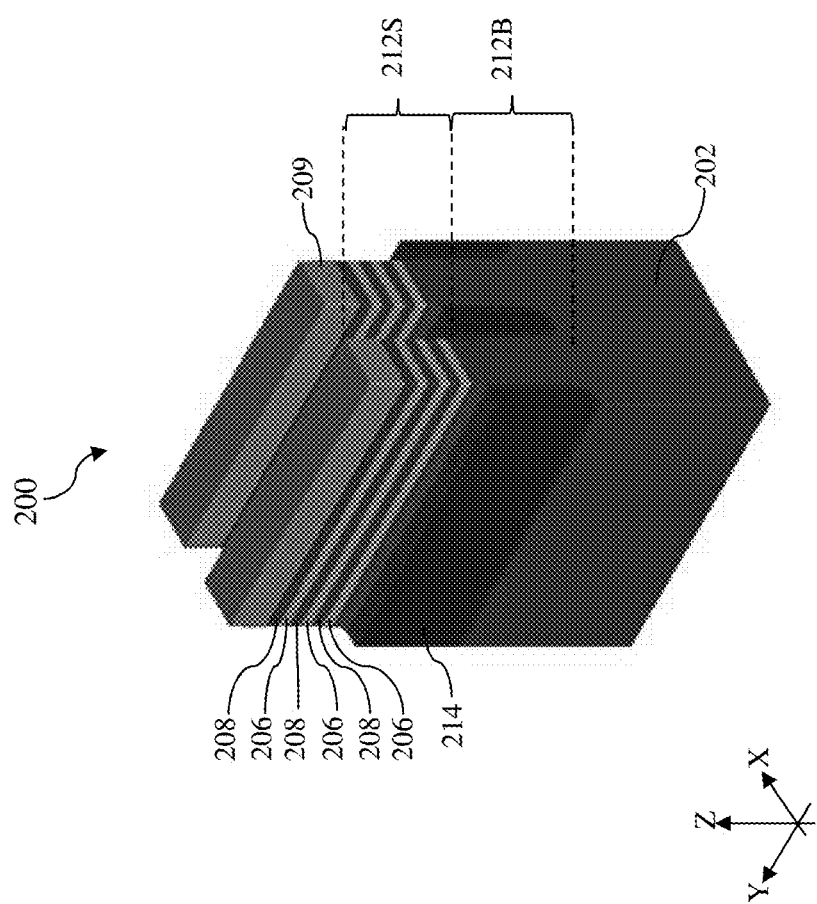

Referring to FIGS. 1, 3A-5A, 3B-5B, and 3C-5C, method 100 includes a block 106 where an isolation feature 214 is formed. After the fin-shaped structures 212 are formed, the isolation feature 214 shown in FIGS. 5A and 5C is formed between neighboring fin-shaped structures 212. The isolation feature 214 may also be referred to as a shallow trench isolation (STI) feature 214. In an example process, a dielectric material for the isolation feature 214 is first deposited over the workpiece 200, filling the trenches between fin-shaped structures 212 with the dielectric material, as shown in FIGS. 3A, 3B and 3C. Although not explicitly, the dielectric material for the isolation feature 214 is also deposited in the fin cut opening 213 (shown FIG. 2D). In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process, until at least a portion of the hard mask layer 210 is exposed, as illustrated in FIGS. 4A, 4B and 4C. In the depicted embodiment, the planarization is performed until the first layer 209 is exposed. In other embodiments not explicitly shown, the planarization may be performed until the second layer 211 is exposed. Referring then to FIGS. 5A, 5B and 5C, the planarized dielectric material is further recessed by a dry etching process, a wet etching process, and/or a combination thereof to form the isolation feature 214. As shown in FIGS. 5A and 5C, the stack portions 212S of the fin-shaped structures 212 rise above the isolation feature 214 while the base portions 212B are surrounded by the isolation feature 214. In some embodiments, in order to protect the sacrificial layers 206 from unintentional etching, a silicon liner 2100 is conformally deposited over the fin-shaped structures 212 using ALD or CVD. In some implementations, the silicon liner 2100 is epitaxially grown from the surfaces of the fin-shaped structures 212. In those implementations, the first layer 209 may be formed of silicon germanium and the second layer 211 may be formed of silicon.

Figure 6A:
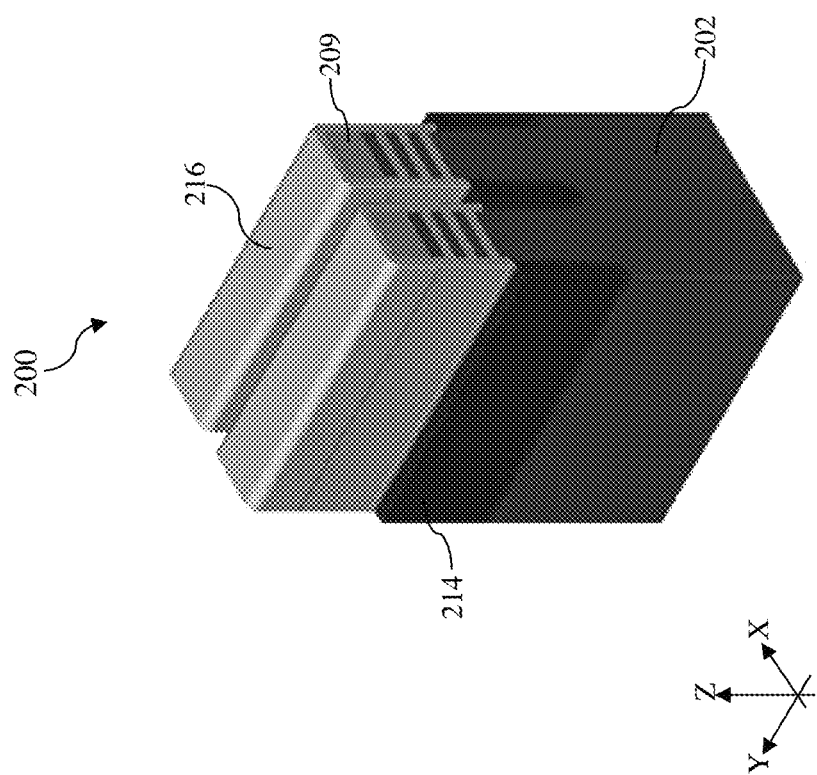
Figure 10B:
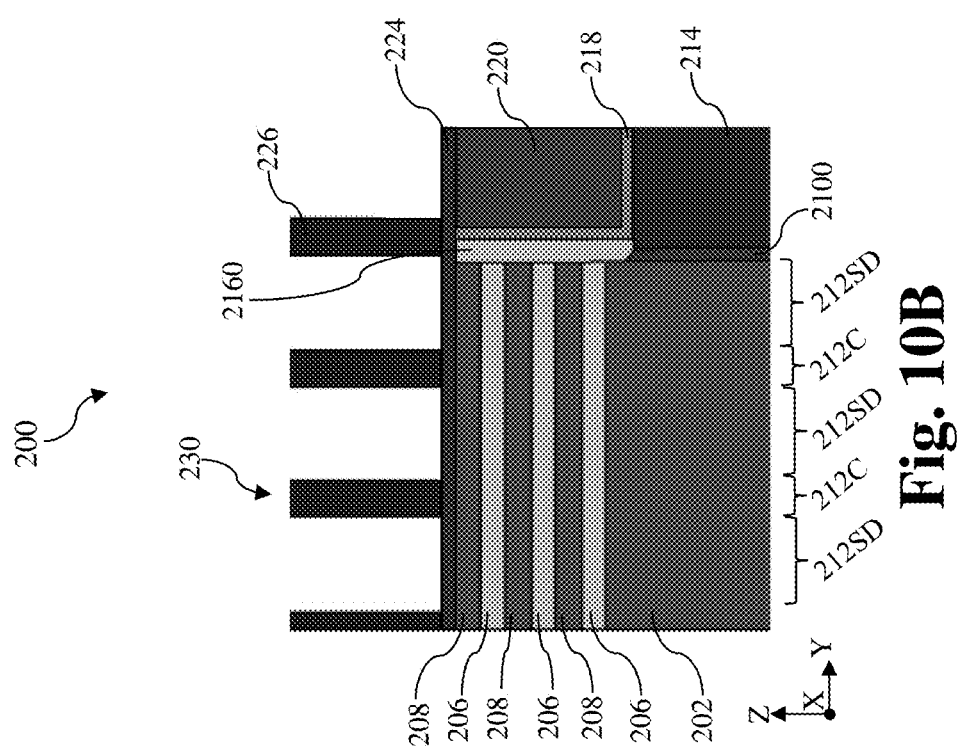

Referring to FIGS. 1 and 6A-6C, method 100 includes a block 108 where a cladding layer 216 is formed over the fin-shaped structures 212. In some embodiments, the cladding layer 216 may have a composition similar to that of the sacrificial layers 206. In one example, the cladding layer 216 may be formed of silicon germanium (SiGe), just like the sacrificial layers 206. This common composition allows selective removal of the sacrificial layers 206 and the cladding layer 216 in a subsequent process. In some embodiments, the cladding layer 216 may be conformally and epitaxially grown using vapor phase epitaxy (VPE) or molecular bean epitaxy (MBE). In some alternative embodiments, the cladding layer 216 may be deposited using chemical vapor deposition (CVD), atomic layer deposition (ALD), or other suitable deposition method. As shown in FIGS. 6A, 6B and 6C, the cladding layer 216 is disposed on sidewalls of the fin-shaped structures 212, end sidewalls 215 (not explicitly shown in FIGS. 6A, 6b and 6C but are shown in FIG. 10B), and the top surface of the first layer 209. In some embodiments where the deposition of the cladding layer 216 is not selective, operations at block 108 may include etch back processes to remove cladding layer 216 on the top surfaces of the isolation feature 214. An example etch back process may be a dry etch process that includes use of plasma of hydrogen bromide (HBr), oxygen ($O_2$), chlorine ($Cl_2$), or mixtures thereof. In some instances, the cladding layer 216 may have a thickness between about 5 nm and about 10 nm. In some embodiments where the deposition of the cladding layer 216 is selective and the first layer 209 is formed of silicon germanium, the aforementioned etch back operations may be omitted at block 108. In some alternative embodiments not shown in the figures, the first layer 209 is formed of silicon nitride and is completely removed before the formation of the cladding layer. In those alternative embodiments, the deposition of the cladding layer 216 is by epitaxial growth and is selective to semiconductor materials.

Figure 7A:
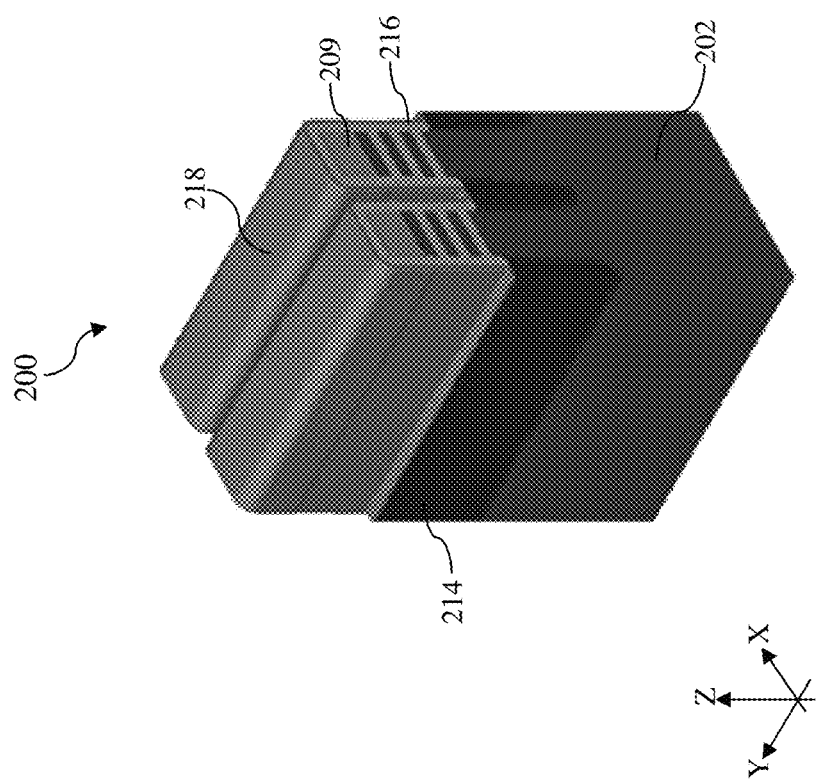
Figure 8A:
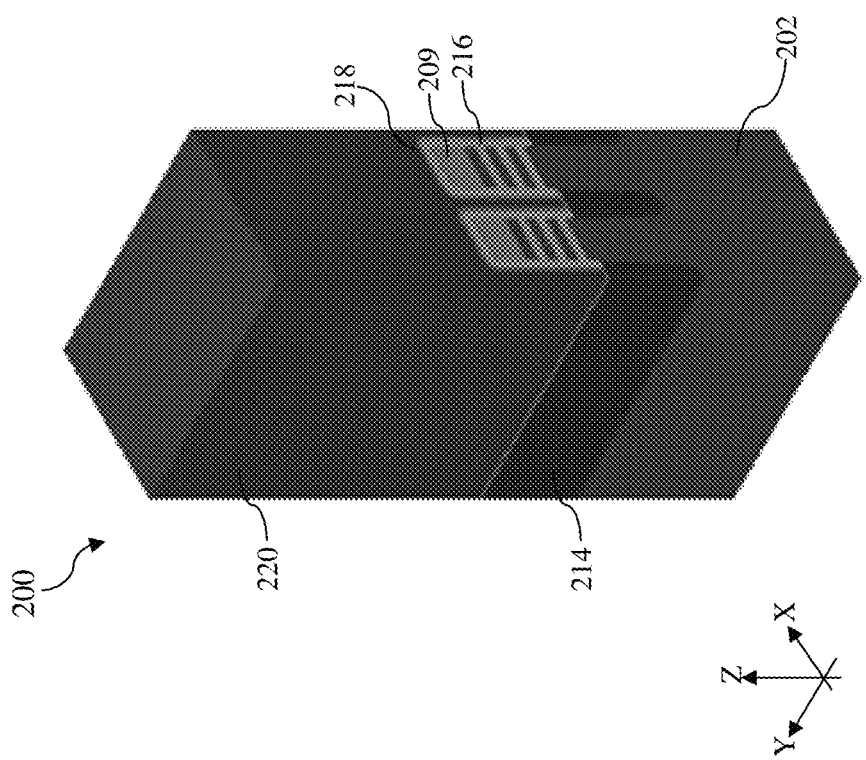
Figure 8C:
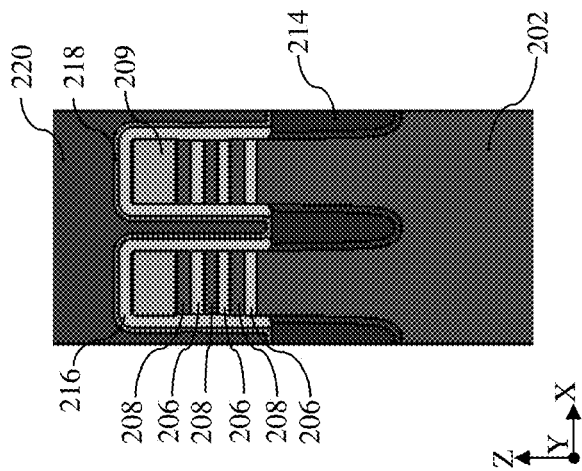
Figure 8B:
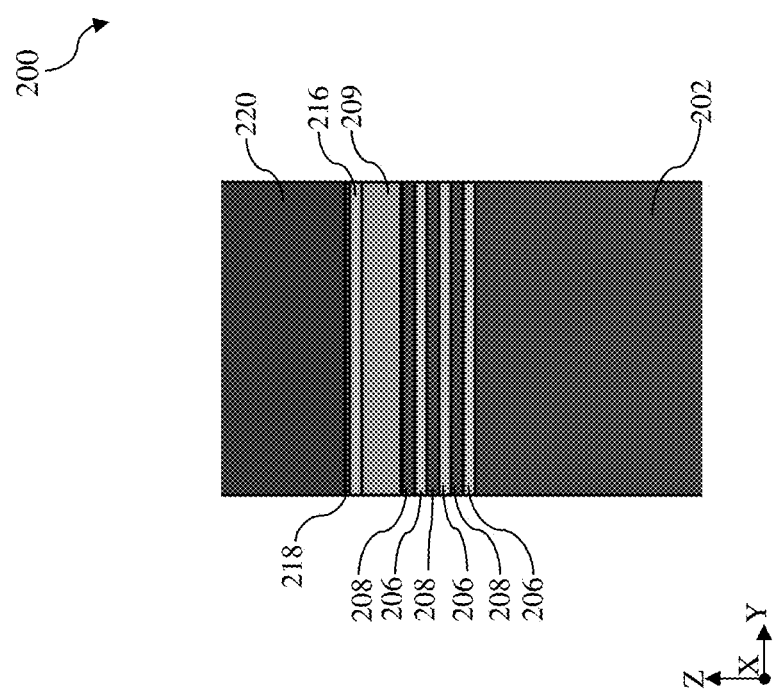
Figure 9A:
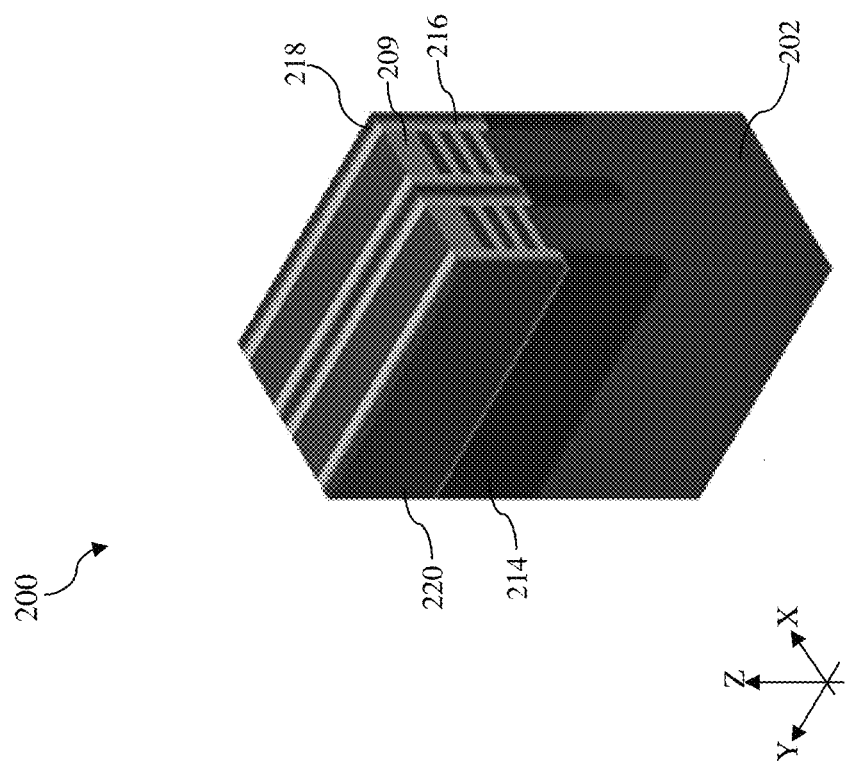

Referring to FIGS. 1 and 7A-7C, method 100 includes a block 110 where a fin spacer 218 is formed over the cladding layer 216. In some embodiments, the fin spacer 218 is formed of a dielectric material to allow selective etching of the cladding layer 216 without substantially damaging the fin spacer 218. The fin spacer 218 may include silicon nitride, silicon oxynitride, silicon oxycarbonitride, or silicon carbonitride. In some implementations, the fin spacer 218 may be deposited using CVD, ALD, or other suitable deposition methods. As shown in FIGS. 7A-7C, the fin spacer 218 is disposed on the top surface of the isolation feature 214 as well as sidewalls and top surfaces of the cladding layer 216. The fin spacer 218 is also deposited over the cladding layer 216 that is disposed on end sidewall 215. Although the fin spacer 218 over the end sidewall 215 is not explicitly shown in FIGS. 7A-7C, it is shown in FIG. 10B.

Referring to FIGS. 1 and 8A-8C, method 100 include a block 112 where a filler layer 220 is deposited over the workpiece 200. In some embodiments, a composition of the filler layer 220 may be similar to a composition of the isolation feature 214. In these embodiments, the filler layer 220 may be deposited using a CVD process, an SACVD process, an FCVD process, an ALD process, a PVD process, spin-on coating, and/or other suitable process. In an example, the filler layer 220 may be deposited using an FCVD process to a thickness about 2000 nm and about 4500 nm, as measured from the first layer 209 or the topmost channel layer 208 (if the hard mask layer 210 is completely removed in earlier processes).

Referring to FIGS. 1 and 9A-9C, method 100 includes a block 114 where the workpiece 200 is planarized. In some embodiments, the workpiece 200 is planarized using a CMP process until top surfaces of the first layer 209 are exposed. In some alternative embodiments not explicitly shown, the first layer is either removed in an earlier process or is removed by the planarization at block 114. In these alternative embodiments, the topmost channel layer 208 may be exposed in the top surface.

Referring to FIGS. 1 and 10B, method 100 includes a block 116 where dummy gate stacks 230 are formed over the fin-shaped structures 212. In some embodiments, a gate replacement process (or gate-last process) is adopted where the dummy gate stacks 230 serves as placeholders for functional gate structures. Other processes and configuration are possible. As shown in FIG. 10B, each of the dummy gate stacks 230 includes a dummy electrode 226 disposed over a dummy dielectric layer 224. The regions of the fin-shaped structures 212 underlying the dummy gate stacks 230 may be referred to as channel regions 212C. Each of the channel regions 212C in a fin-shaped structure 212 is sandwiched between two source/drain regions 212SD for source/drain formation. In an example process, the dummy dielectric layer 224 is blanketly deposited over the workpiece 200 by CVD. A material layer for the dummy gate electrodes 226 is then blanketly deposited over the dummy dielectric layer 224. In order to pattern the material layer into dummy electrodes 226, a gate top hard mask (not shown) is deposited over the material layer. The gate top hard mask may be a multi-layer and include a silicon nitride mask layer and a silicon oxide mask layer over the silicon nitride mask layer. The material layer for the dummy electrodes 226 are then patterned using photolithography processes to form the dummy electrodes 226. In some embodiments, the dummy dielectric layer 224 may include silicon oxide and the dummy electrodes 226 may include polycrystalline silicon (polysilicon). In some embodiments represented in FIG. 10B, one of the dummy electrodes 226 is formed at least partially over the cladding layer 216 deposited along the end sidewall 215 of the fin-shaped structure 212. For ease of the reference, the portion of the cladding layer 216 along the end sidewall 215 may be referred to the end cladding layer 216O. As shown in FIG. 10B, the top surface of the end cladding layer 216O is in direct contact with the dummy dielectric layer 224. Although not explicitly shown in FIG. 10B, portions of the dummy dielectric layer 224 that is not protected by the dummy electrodes 226 may be anisotropically etched and removed. As a result, each of the dummy gate stacks includes the dummy dielectric layer 224 and a dummy electrode 226 over the dummy dielectric layer 224.

Figure 11B:
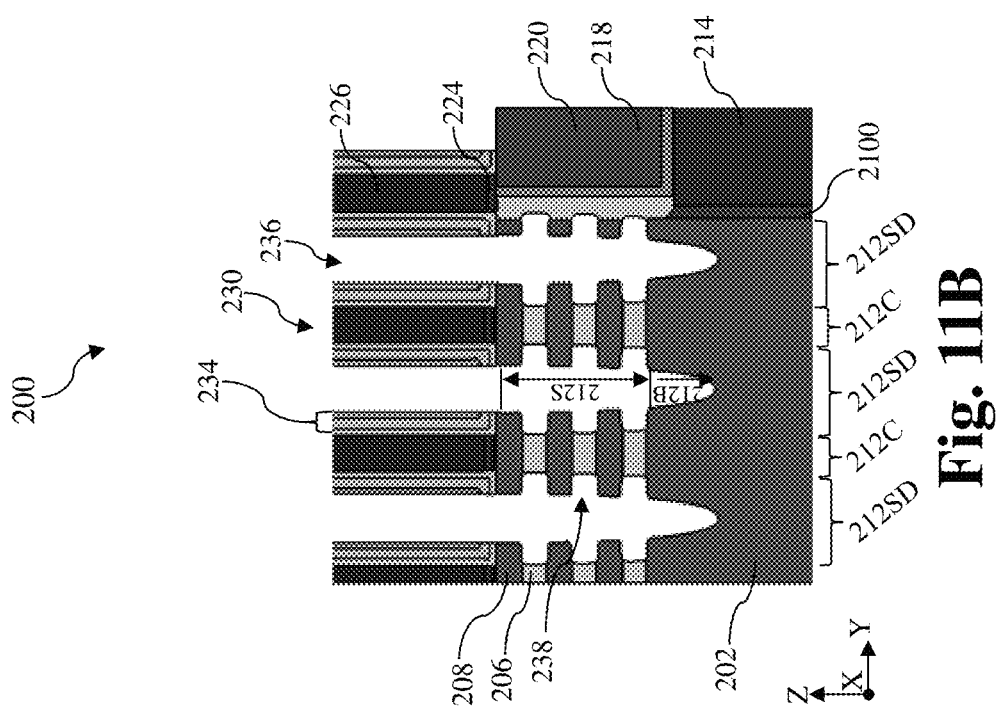

Referring to FIGS. 1 and 11B, method 100 includes a block 118 where at least one gate spacer 234 is formed along sidewalls of the dummy gate stacks 230. The at least one gate spacer 234 may include two or more gate spacer layers. Dielectric materials for the at least one gate spacer 234 may be selected to allow selective removal of the dummy gate stacks 230. Suitable dielectric materials may include silicon nitride, silicon oxycarbonitride, silicon carbonitride, silicon oxide, silicon oxycarbide, silicon carbide, silicon oxynitride, and/or combinations thereof. The at least one gate spacer 234 may be conformally deposited over the workpiece 200 using CVD, subatmospheric CVD (SACVD), or ALD.

Referring to FIGS. 1 and 11B, method 100 includes a block 120 where the source/drain regions 212SD are recessed to form source/drain trenches 236. With the dummy gate stacks 230 and the at least one gate spacers 234 serving as an etch mask, the workpiece 200 is anisotropically etched to form the source/drain trenches 236 over the source/drain regions 212SD. In some embodiments as illustrated in FIG. 11B, operations at block 120 may substantially remove the stack portions 212S of fin-shaped structures 212 in the source/drain regions 212SD and the source/drain trenches 236 may extend into the base portions 212B, which is formed from the substrate 202. The anisotropic etch at block 120 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 12B:
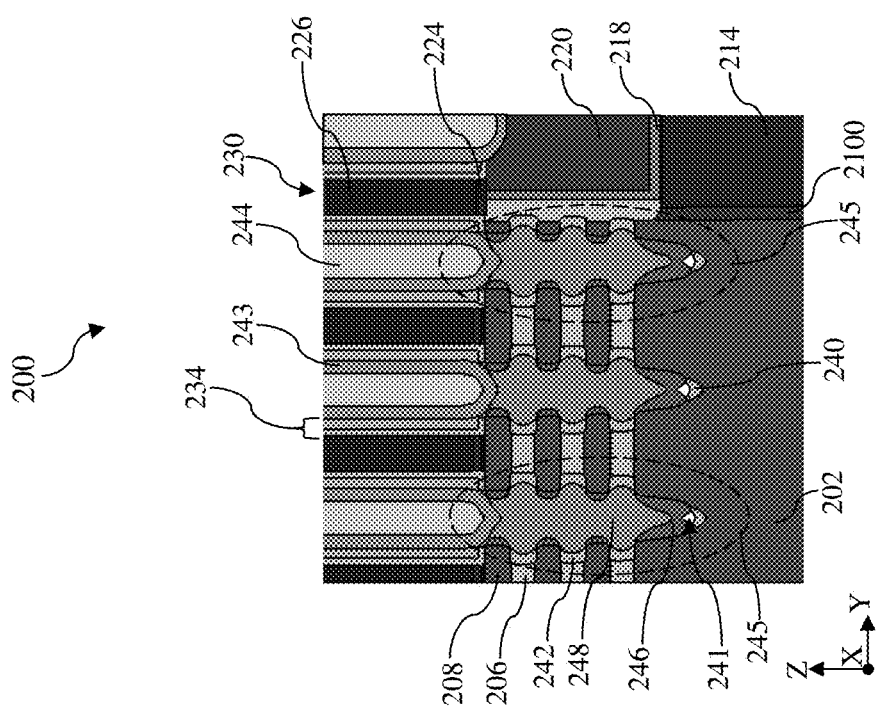

Referring to FIGS. 1, 11B and 12B, method 100 includes a block 122 where inner spacer features 242 are formed. Referring to FIG. 11B, at block 122, the sacrificial layers 206 exposed in the source/drain trenches 236 are first selectively and partially recessed to form inner spacer recesses 238, while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone. In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or $NH_4OH$ etchant. Because the cladding layer 216 and the sacrificial layers 206 share a similar composition, the cladding layer 216 may be etched at block 122. The end cladding layer 216O, however, is protected by the dummy gate stack 230 and the at least one gate spacer 234 over it and is not etched. An inner spacer material layer is then conformally deposited using CVD or ALD over the workpiece 200, including over and into the inner spacer recesses 238. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 242, as illustrated in FIG. 12B. In some embodiments, the inner spacer material may be deposited on the bottom surfaces of the source/drain trenches 236 and may remain after the etch back process, leaving behind a bottom feature 240. As both the bottom feature 240 and the inner spacer features 242 are formed from the same inner spacer material, they naturally have the same composition.

Referring to FIGS. 1 and 12B, method 100 includes a block 124 where source/drain features 245 are formed in the source/drain trenches 236. In some embodiments, each of the source/drain features 245 may include an outer layer 246 and an inner layer 248. To form the source/drain features 245, the outer layer 246 is first selectively and epitaxially deposited on the exposed semiconductor surfaces of the channel layers 208 and the substrate 202 and then, the inner layer 248 is selectively and epitaxially deposited on the outer layer 246. The source/drain features 245, including the outer layer 246 and the inner layer 248, may be deposited using an epitaxial process, such as vapor-phase epitaxy (VPE), ultra-high vacuum CVD (UHV-CVD), molecular beam epitaxy (MBE), and/or other suitable processes. The source/drain features 245 may be either n-type or p-type. When the source/drain features 245 are n-type, each of the outer layer 246 and the inner layer 248 may include silicon (Si) and may be doped with an n-type dopant, such as phosphorus (P) or arsenic (As). When the source/drain features 245 are p-type, each of the outer layer 246 and the inner layer 248 may include silicon germanium (SiGe) or germanium (Ge) and may be doped with a p-type dopant, such as boron (B) or gallium (Ga). Regardless of the conductivity type of the source/drain features 245, a doping concentration in the inner layer 248 may be greater than the outer layer 246 to reduce contact resistance. In some implementations, the inner layer 248 and the outer layer 246 may be doped with the same dopant species. In some alternative implementations, the inner layer 248 and the outer layer 246 may be doped with different dopant species. Doping of the outer layer 246 and the inner layer 248 may be performed either in situ with their deposition or ex-situ using an implantation process, such as a junction implant process.

Referring to FIG. 12B, although the epitaxial deposition of the inner layer 248 is selectively to semiconductor surfaces, overgrowth of the inner layer 248 may merge over the inner spacer features 242. Additionally, due to the selective nature, the outer layer 246 may not be deposited over the bottom feature 240, leaving behind a void 241. As shown in FIG. 12B, the void 241 is disposed between a bottom portion of the outer layer 246 and the bottom feature 240.

Referring to FIGS. 1 and 12B, method 100 includes a block 126 where a contact etch stop layer (CESL) 243 and an interlayer dielectric (ILD) layer 244 are deposited. In an example process, the CESL 243 is first conformally deposited over the workpiece 200 and then the ILD layer 244 is blanketly deposited over the CESL 243. The CESL 243 may include silicon nitride, silicon oxide, silicon oxynitride, and/or other materials known in the art. The CESL 243 may be deposited using ALD, plasma-enhanced chemical vapor deposition (PECVD) process and/or other suitable deposition or oxidation processes. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by spin-on coating, an FCVD process, or other suitable deposition technique. In some embodiments, after formation of the ILD layer 244, the workpiece 200 may be annealed to improve integrity of the ILD layer 244. To remove excess materials and to expose top surfaces of the dummy electrodes 226 of the dummy gate stacks 230, a planarization process (such a chemical mechanical polishing (CMP) process) may be performed to the workpiece 200 to provide a planar top surface, as illustrated in FIG. 12B. Top surfaces of the dummy electrodes 226 are exposed on the planar top surface.

Figure 13B:
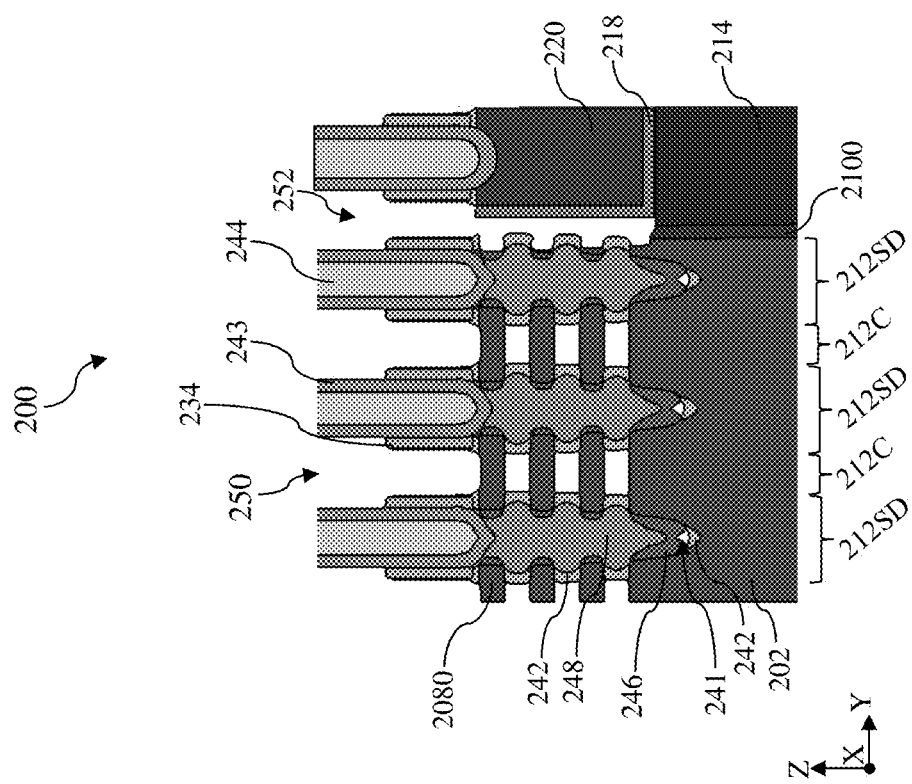

Referring to FIGS. 1 and 13B, method 100 includes a block 128 where the dummy gate stacks 230 are removed and channel members 2080 are released. At block 128, the dummy gate stacks 230 exposed due to operations at block 126 are removed from the workpiece 200. The removal of the dummy gate stacks 230 results in gate trenches 250 over the channel regions 212C. The removal of the dummy gate stacks 230 may include one or more etching processes that are selective to the material in the dummy gate stacks 230. For example, the removal of the dummy gate stacks 230 may be performed using as a selective wet etch, a selective dry etch, or a combination thereof. After the removal of the dummy gate stacks 230, sidewalls of channel layers 208 and sacrificial layers 206 in the channel regions 212C are exposed in the gate trenches 250. The exposed sacrificial layers 206 between the channel layers 208 in the channel regions 212C may be selectively removed to release the channel layers 208 to form channel members 2080. The channel members 2080 are vertically stacked along the Z direction. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. Because the cladding layer 216 and the end cladding layer 2160 share a similar composition with the sacrificial layers 206, they are also selectively removed at block 128. As shown in FIG. 13B, the removal of the end cladding layer 2160 forms an end trench 252. Sidewalls of the fin spacer 218, inner spacer features 242, the isolation feature 214, the silicon liner 2100 are exposed in the end trench 252.

Figure 14B:
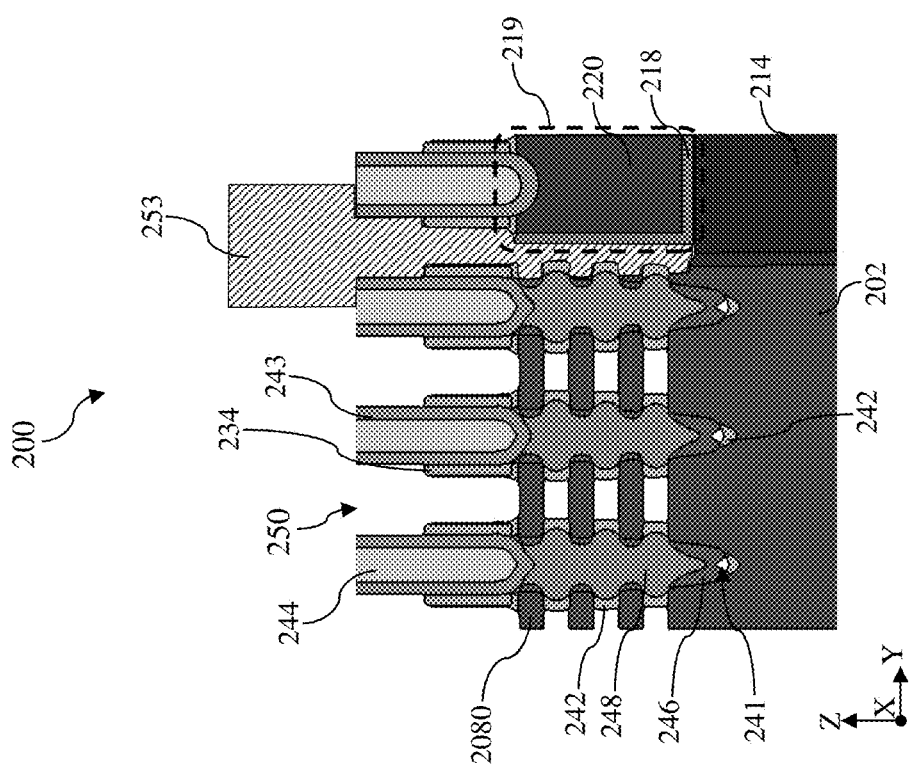
Figure 15B:
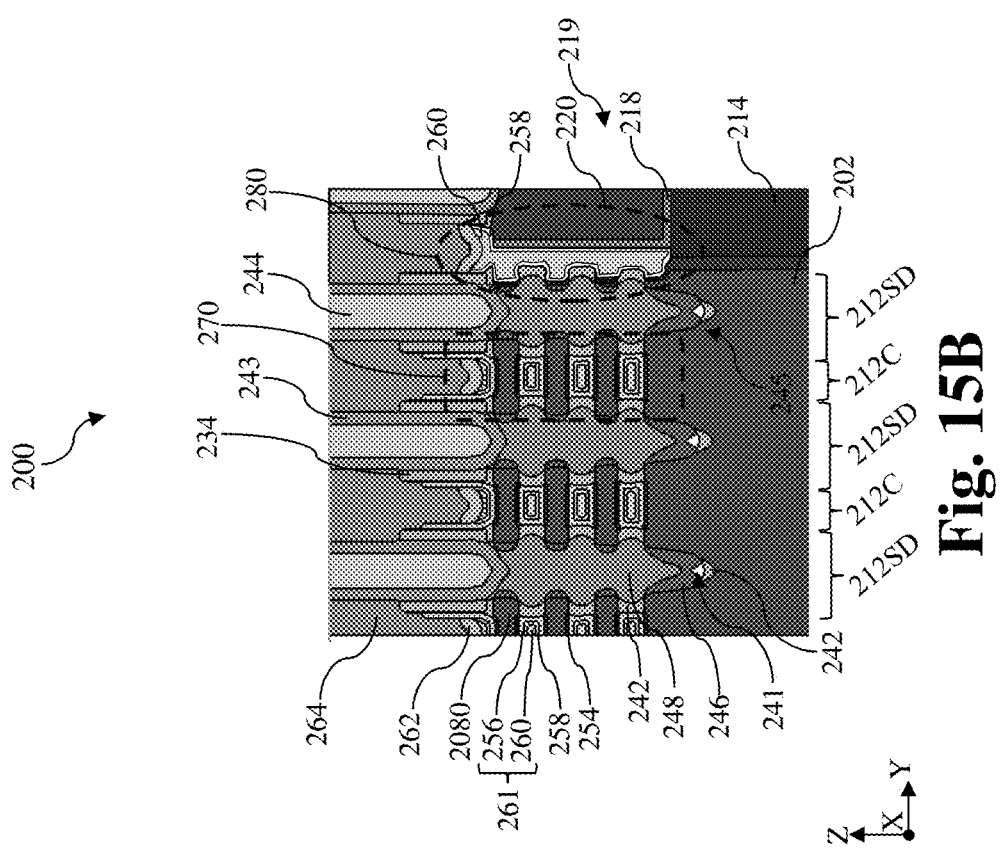

Referring to FIGS. 1, 14B and 15B, method 100 includes a block 130 where an interfacial layer 254 and a gate dielectric layer 256 are deposited in the gate trenches 250 while the end trench 252 is covered. In order to selectively form interfacial layer 254 and the gate dielectric layer 256 in the gate trenches 250 but not in the end trench 252, a photoresist feature 253 is formed into and over the end trench 252. In an example process illustrated in FIG. 14B, a photoresist layer is deposited over the workpiece 200 and then is patterned using photolithography processes to form the photoresist feature 253 to protect the end trench 252. As shown in FIG. 15B, the interfacial layer 254 and the gate dielectric layer 256 are then sequentially deposited to wrap around each of the channel members 2080. In some embodiments, the interfacial layer 254 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 to form the interfacial layer 254. The gate dielectric layer 256 is then deposited over the interfacial layer 254 using ALD, CVD, and/or other suitable methods. The gate dielectric layer 256 may be formed of high-K dielectric materials. As used herein, high-k dielectric materials include dielectric materials having a high dielectric constant, for example, greater than that of thermal silicon oxide (~3.9).

The gate dielectric layer 256 may include hafnium oxide. Alternatively, the gate dielectric layer 256 may include other high-K dielectrics, such as titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. It is noted that because the interfacial layer 254 and the gate dielectric layer 256 are formed or deposited while the end trench 252 is covered, they are not formed or deposited on surfaces in the end trench 252. After the formation or deposition of the interfacial layer 254 and the gate dielectric layer 256, the photoresist feature 253 is removed, exposing the end trench 252 (shown in FIG. 13B).

Referring to FIG. 14B, the fin spacer 218 and the filler layer 220 deposited over the fin cut opening 213 (shown in FIG. 2D) may collectively constitute an isolation structure 219 that is disposed over the isolation feature 214. In the isolation structure 219, the filler layer 220 is disposed over a horizontal portion (extending along the Y direction) of the fin spacer 218 and a vertical portion (extending along the Z direction) of the fin spacer 218 extends along a sidewall of the filler layer 220.

Referring to FIGS. 1 and 15B, method 100 includes a block 132 where a gate electrode layer 261 is deposited. With the end trench 252 exposed, the gate electrode layer 261 is deposited in the gate trenches 250 and the end trench 252. The gate electrode layer 261 may be a multi-layer structure that includes at least one work function layer 258 and a metal fill layer 260. By way of example, the at least one work function layer 258 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer 260 may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 261 may be formed by ALD, PVD, CVD, e-beam evaporation, or other suitable process. In various embodiments, a planarization process, such as a CMP process, may be performed to remove excessive materials to provide a substantially planar top surface of the gate structures.

Referring to FIG. 15B, operations at blocks 130 and 132 form gate structures 270 to wrap around channel members 2080 in channel regions 212C and a gate extension structure 280 that are in contact with the adjacent source/drain feature 245. In some embodiments illustrated in FIG. 15B, each of the gate structures 270 includes the interfacial layer 254, the gate dielectric layer 256, the at least one work function layer 258, and the metal fill layer 260. Each of the gate structures 270 wraps around the channel members 2080. The gate extension structure 280 includes only the at least one work function layer 258 and the metal fill layer 260 and is allowed to be electrically coupled to the adjacent source/drain feature 245 through direct contact. The gate extension structure 280 is disposed between the adjacent source/drain feature 245 and the isolation structure 219. The gate extension structure 280 is also in direct contact with the inner spacer features 242 in contact with the adjacent source/drain feature 245. In that regard, portions of the gate extension structure 280 is disposed between the inner spacer features 242 and the vertical portion of the fin spacer 218. Because the at least one work function layer 258 is deposited before the deposition of the metal fill layer 260, the at least one work function layer 258 is in contact with the outer layer 246 of the source/drain feature 245, the inner spacer features 242, and the vertical portion of the fin spacer 218, the at least one gate spacer 234, and the filler layer 220, while the metal fill layer 260 is spaced apart from them. In some embodiments, the at least one work function layer 258 of the gate extension structure 280 is spaced apart from the inner layer 248 of the source/drain feature 245.

The gate extension structure 280 may be an extension of a connecting gate structure that is aligned with the gate extension structure 280 along the X direction. The connecting gate structure includes an interfacial layer like the interfacial layer 254, a gate dielectric layer like the gate dielectric layer 256, the at least one work function layer 258, and the metal fill layer 260. Due to the implementation of the photoresist feature 253, only the at least one work function layer 258 and the metal fill layer 260 of the connecting gate structure continues into the end trench 252 to form the gate extension structure 280. In other words, the gate extension structure 280 is integral with the connecting gate structure and allows the connecting gate structure to electrically couple to the source/drain feature 245.

Figure 16B:
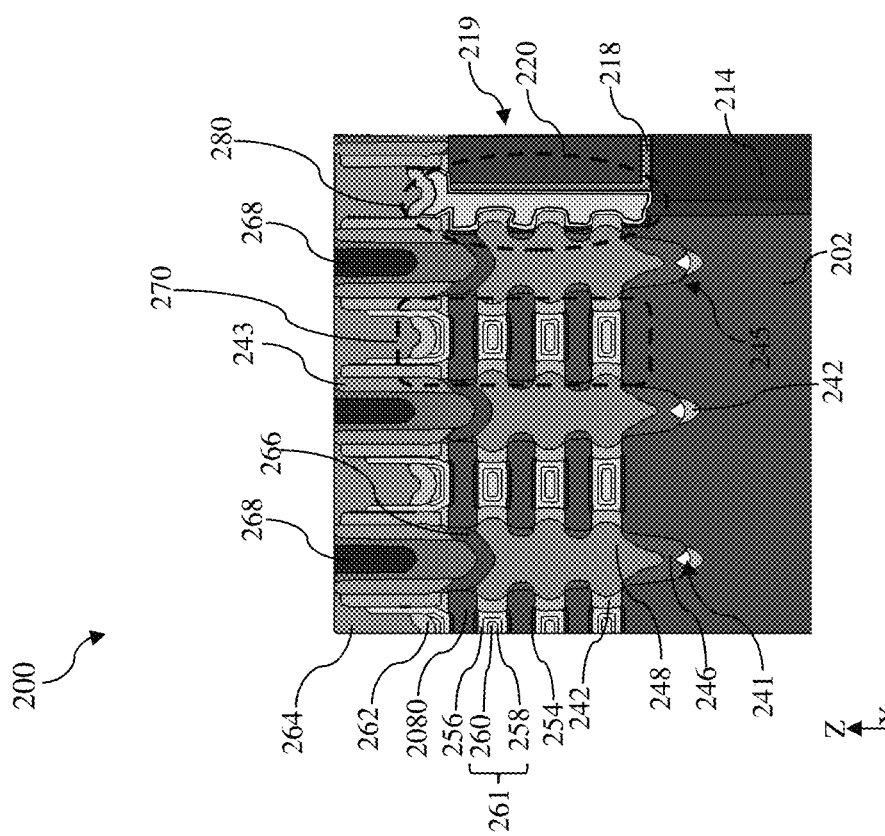

Referring to FIG. 16B, upon conclusion of the operations at block 132, further processes may be performed to complete fabrication of the semiconductor device 200. Such further processes may include deposition of gate capping layers 262, formation a gate self-aligned-contact (SAC) dielectric layer 264, formation of a silicide layer 266, and formation of the source/drain contact 268. In some embodiments, the gate capping layer 262 may include nickel (Ni), titanium (Ti), or cobalt (Co). The gate SAC dielectric layer 264 may include silicon nitride, silicon oxynitride, silicon oxycarbonitride, or silicon carbonitride. The silicide layer 266 may include titanium silicide (TiSi), titanium silicon nitride (TiSiN), tantalum silicide (TaSi), tungsten silicide (WSi), cobalt silicide (CoSi), or nickel silicide (NiSi). The source/drain contact 268 may include a barrier layer and a metal plug. The barrier layer may include titanium nitride, tantalum nitride, cobalt nitride, nickel nitride, or other metal nitride and the metal plug may include aluminum (Al), tungsten (W), nickel (Ni), titanium (Ti), ruthenium (Ru), cobalt (Co), platinum (Pt), or copper (Cu).

By using the gate extension structure 280 to electrically couple to a source/drain feature 245 shown in FIG. 15B or 16B, embodiments of the present disclosure may be applied to connect a gate structure of one transistor to a source/drain feature of another transistor. An example of such an application is described below in conjunction with FIGS. 17, 18 and 19.

Figure 17:
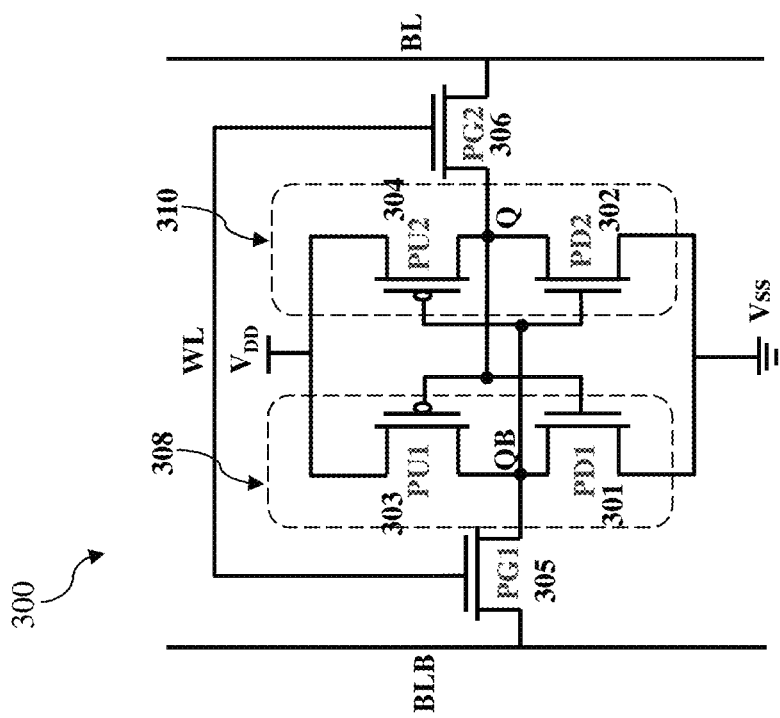
FIG. 17 illustrates a circuit diagram of an SRAM cell, according to one or more aspects of the present disclosure.

An example SRAM cell 300 is illustrated in FIG. 17. The SRAM cell 300 includes first and second pass-gate transistors (PG1) 305 and (PG2) 306, first and second pull-up transistors (PU1) 303 and (PU2) 304, and first and second pull-down transistors (PD1) 301 and (PD2) 302. In SRAM cell 300, each of the pass-gate transistors, pull-up transistors and pull-down transistors may be a multi-gate transistor, such as an MBC transistor. The gates of the first pass-gate transistor (PG1) 305 and second pass-gate transistors (PG2) 306 are electrically coupled to a word line (WL) that determines whether the SRAM cell 300 is selected/activated or not. In the SRAM cell 300, a memory bit (e.g., a latch or a flip-flop) is formed of the first pull-up transistor (PU1) 303, the second pull-up transistor (PU2) 304, the first pull-down transistor (PD1) 301, and the second pull-down transistor (PD2) 302 to store a bit of data. The complementary values of the bit are stored in a first storage node QB and a second storage node Q. The stored bit can be written into, or read from, the SRAM cell 300 through Bit-line (BL) and Bit-Line Bar (BLB). In this arrangement, the BL and BLB may carry complementary bit-line signals. The SRAM cell 300 is powered through a voltage bus that has a positive power supply voltage (Vdd) and is also connected to a ground potential bus at ground potential (Vss). The SRAM cell 300 includes six (6) transistors and may be referred to as a 6T SRAM cell.

The SRAM cell 300 includes a first inverter 308 formed of the first pull-up (PU1) transistor 303 and the first pull-down transistor (PD1) 301 as well as a second inverter 310 formed of the second pull-up transistor (PU2) 304 and the second pull-down transistor (PD2) 302. The first inverter 308 and the second inverter 310 are coupled between the positive power supply voltage (Vdd) and the ground potential (Vss). As shown in FIG. 17, the first inverter 308 and second inverter 310 are cross-coupled. That is, the first inverter 308 has an input coupled to the output of the second inverter 310. Likewise, the second inverter 310 has an input coupled to the output of the first inverter 308. The output of the first inverter 308 is the first storage node QB. Likewise, the output of the second inverter 310 is the second storage node Q. In a normal operating mode, the first storage node QB is in the opposite logic state as the second storage node Q. By employing the two cross-coupled inverters, the SRAM cell 300 can hold the data using a latched structure so that the stored data will not be lost without applying a refresh cycle as long as power is supplied through Vdd.

Figure 18:
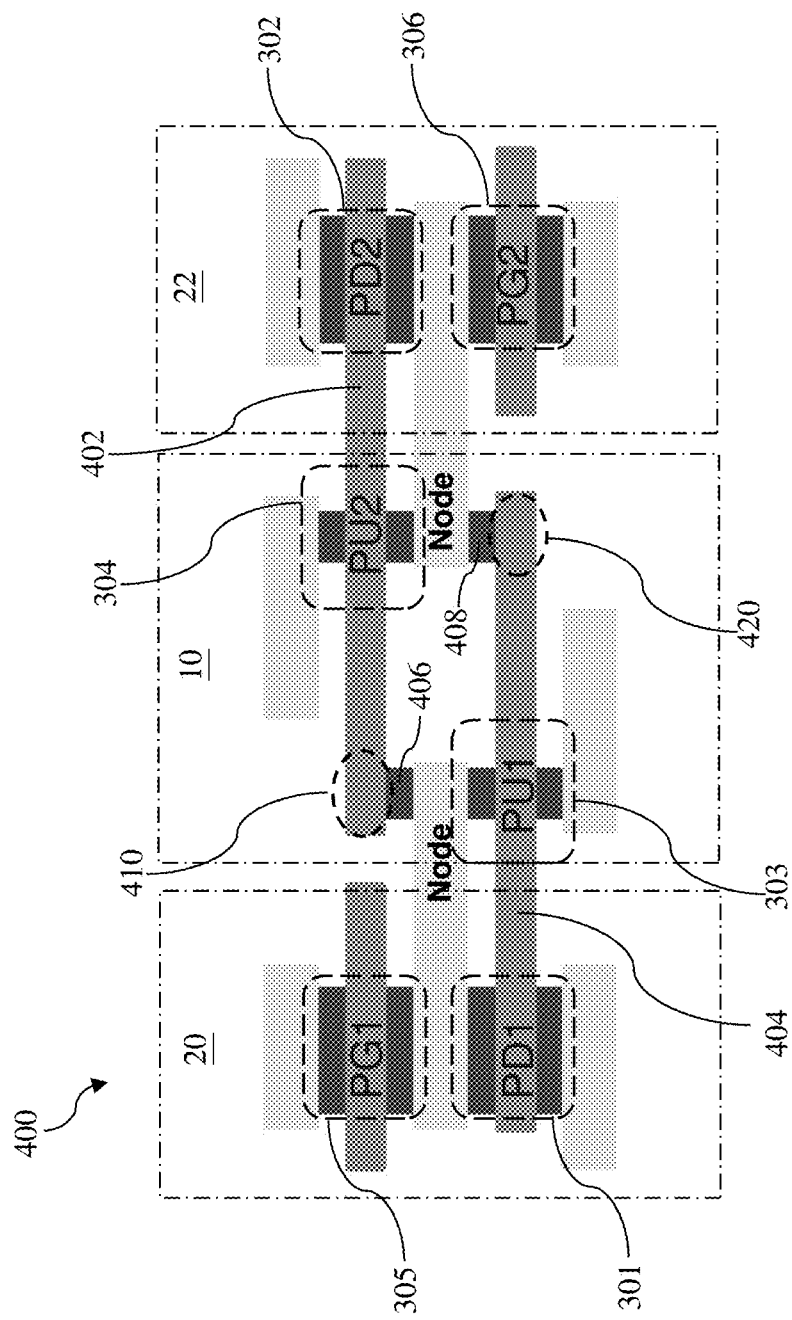
FIGS. 18 and 19 illustrate a layout for implementing the SRAM cell in FIG. 17, according to one or more aspects of the present disclosure.

Referring to FIG. 18, the SRAM cell 300 may be implemented using a layout 400. In layout 400, the second pull-up transistor (PU2) 304 and the second pull-down transistor (PD2) 302 share a first gate structure 402. The first pull-up transistor (PU1) 303 and the first pull-down transistor (PD1) 301 share a second gate structure 404. To make the SRAM cell 300 function properly, the first drain 406 of the first pull-up transistor (PU1) 303 is electrically coupled to the first gate structure 402 and the second drain 408 of the second pull-up transistor (PU2) 304 is electrically coupled to the second gate structure 404. Conventionally, a butted contact may be formed over the first drain 406 and the first gate structure 402 to connect the same and another butted contact may be formed over the second drain 408 and the second gate structure 404 to connect them. When embodiments of the present disclosure, such as those illustrated in FIGS. 15B and 16B, are implemented, no such butted contacts are needed. As shown in FIG. 18, the first gate structure 402 may have a first gate extension structure 410. The first gate extension structure 410 and the first gate structure 402 share the same work function layer and metal fill layer but the first gate extension structure 410 does not include any interfacial layer or gate dielectric layer. As such, the first gate extension structure 410 is in direct contact with the source/drain feature that constitutes the first drain 406. Similarly, the second gate structure 404 may have a second gate extension structure 420. The second gate extension structure 420 and the second gate structure 404 share the same work function layer and metal fill layer but the second gate extension structure 420 does not include any interfacial layer or gate dielectric layer. As such, the second gate extension structure 420 is in direct contact with the source/drain feature that constitutes the second drain 408.

In some embodiments, the first pull-up transistor (PU1) 303 and the second pull-up transistor (PU2) 304 are p-type MBC transistors that formed in an n-well 10; the first pull-down transistor (PD1) 301 and the first pass-gate transistor (PG1) 305 are n-type MBC transistors that formed in a first p-well 20; and the second pull-down transistor (PD2) 302 and the second pass-gate transistor (PG2) 306 are n-type MBC transistors that formed in a second p-well 22. The n-well 10 is disposed between the first p-well 20 and the second p-well 22. In other embodiments, all transistors in the layout 400 are n-type MBC transistors formed in one p-type well.

Figure 19:
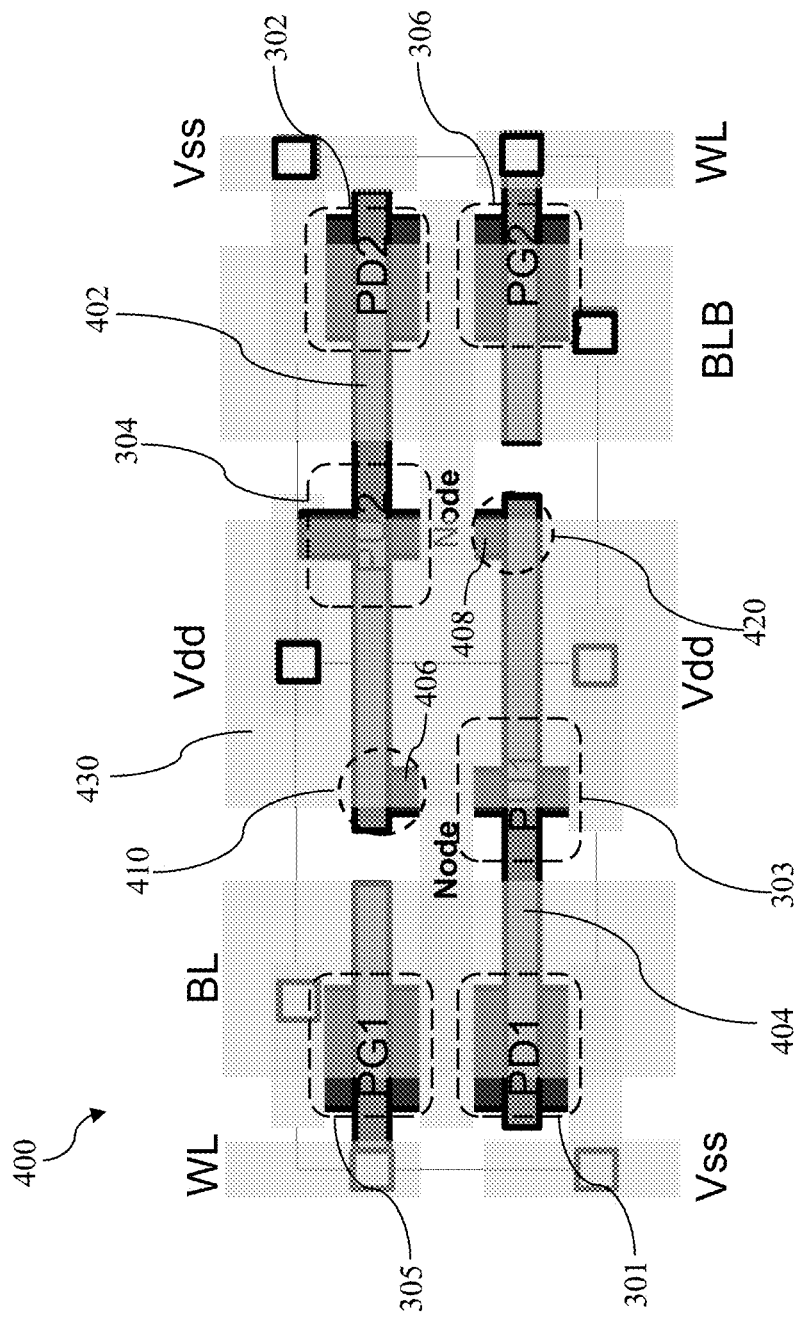

Reference is now made to FIG. 19. A first metal line layer may be formed over the features in the layout 400 to electrically connect different nodes to, the word line (WL), the positive power supply voltage (Vdd), the ground potential (Vss), the Bit-line (BL), and the Bit-line Bar (BLB). For example, a power rail 403 is formed to couple sources of the first pull-up transistor (PU1) 303 and the second pull-up transistor (PU2) 304 to the positive power supply voltage (Vdd). Because of the use of the first gate extension structure 410 and the second gate extension structure 420, no butted contacts come in the way of the power rail 430. The power rail 430 therefore may extend over the first drain 406 and the second drain 408. The increased width of the power rail 403 may improve performance of the SRAM cell 300 implemented in the layout 400.

In one exemplary aspect, the present disclosure is directed to a semiconductor device. The semiconductor device includes a gate extension structure, a first source/drain feature and a second source/drain feature, a vertical stack of channel members extending between the first source/drain feature and the second source/drain feature along a direction, and a gate structure wrapping around each of the vertical stack of channel members. The gate extension structure is in direct contact with the first source/drain feature.

In some embodiments, the gate extension structure partially extends into the first source/drain feature along the direction. In some implementations, the semiconductor device may further include a plurality of inner spacer features disposed on surfaces of the first source/drain feature. In some embodiments, the gate extension structure is in direct contact with the plurality of inner spacer features. In some implementations, the first source/drain feature includes an inner layer and an outer layer, the gate extension structure is in direct contact with the outer layer, and the gate extension structure is spaced apart from the inner layer by the outer layer and the plurality of inner spacer features. In some instances, the semiconductor device may further include an isolation structure extending along a sidewall of the gate extension structure. The isolation structure includes a fin spacer layer and a dielectric feature disposed over the fin spacer layer and a portion of the fin spacer layer extends along a sidewall of the dielectric feature. In some embodiments, the gate extension structure is disposed between the first source/drain feature and the isolation structure. In some embodiments, the fin spacer layer includes silicon nitride, silicon oxynitride, silicon oxycarbonitride, or silicon carbonitride and the dielectric feature includes silicon oxide. In some embodiments, the gate extension structure is in contact with the fin spacer layer and the gate extension structure is spaced apart from the dielectric feature.

In another exemplary aspect, the present disclosure is directed to a static random access memory (SRAM) cell. The SRAM cell includes a first pull-up multi-bridge-channel (MBC) transistor and a first pull-down MBC transistor coupled together to form a first inverter, a second pull-up MBC transistor and a second pull-down MBC transistor coupled together to form a second inverter, a first pass-gate MBC transistor coupled to an output of the first inverter and an input of the second inverter, and a second pass-gate MBC transistor coupled to an output of the second inverter and an input of the first inverter. A first gate electrode of the first pull-down MBC transistor is in direct contact with a first source/drain feature of the second pull-up MBC transistor. A second gate electrode of the second pull-down MBC transistor is in direct contact with a second source/drain feature of the first pull-up MBC transistor.

In some embodiments, the first gate electrode of the first pull-down MBC transistor partially extends into the first source/drain feature of the second pull-up MBC transistor. In some implementations, the second pull-up MBC transistor further includes a plurality of inner spacer features disposed on surfaces of the first source/drain feature of the second pull-up MBC transistor. In some embodiments, the first gate electrode of the first pull-down MBC transistor is in direct contact with the plurality of inner spacer features. In some instances, the first source/drain feature of the second pull-up MBC transistor includes an inner layer and an outer layer, the first gate electrode of the first pull-down MBC transistor is in direct contact with the outer layer, and the first gate electrode of the first pull-down MBC transistor is spaced apart from the inner layer by the outer layer and the plurality of inner spacer features. In some embodiments, the SRAM cell may further include an isolation structure extending along a sidewall of the first gate electrode. The first gate electrode is disposed between the first source/drain feature and the isolation structure.

In yet another exemplary aspect, the present disclosure is directed to a method. The method includes receiving a workpiece that includes a fin-shaped structure extending lengthwise along a first direction. The fin-shaped structure lengthwise terminates at an end surface and includes a base portion and a stack portion over the base portion, and the stack portion includes a plurality of channel layers interleaved by a plurality of sacrificial layers. The method further includes forming an isolation feature extending along sidewalls of the base portion and a lower portion of the end surface, depositing a cladding layer over the stack portion, wherein the cladding layer includes an end portion extending along an upper portion of the end surface, depositing a fin spacer layer over the cladding layer and the isolation feature, after the depositing of the fin spacer layer, depositing a dielectric layer over the workpiece, recessing a source/drain region of the fin-shaped structure to form a source/drain recess, depositing a source/drain feature in the source/drain recess, selectively removing the end portion of the cladding layer to expose the source/drain feature through the upper portion of the end surface, and depositing a gate electrode layer over the upper portion of the end surface to be in direct contact with the source/drain feature.

In some embodiments, the cladding layer includes silicon germanium, the fin spacer layer includes silicon nitride, silicon oxynitride, silicon oxycarbonitride, or silicon carbonitride, and the depositing of the dielectric layer includes depositing a silicon oxide layer using flowable chemical vapor deposition (FCVD). In some implementations, the method may further include after the depositing of the dielectric layer, planarizing the workpiece to expose a top surface of the end portion of the cladding layer, depositing a first dummy gate stack over the top surface of the end portion of the cladding layer, and depositing a second dummy gate stack over a channel region of the fin-shaped structure, the channel region be adjacent the source/drain region. In some implementations, the method may further include selectively and partially recessing the plurality of sacrificial layers exposed in the source/drain recess to form inner spacer recesses, forming inner spacer features in the inner spacer recesses, removing the first dummy gate stack and the second dummy gate stack to form an end trench and a gate trench, respectively, and selectively removing the sacrificial layers exposed in the end trench and the gate trench. In some instances, the method may further include after the selectively removing of the sacrificial layers, selectively depositing a photoresist layer over the end trench, after the selectively depositing of the photoresist layer but before the depositing of the gate electrode layer, depositing an interfacial layer and a gate dielectric layer in the gate trench, and after the depositing of the interfacial layer and the gate dielectric layer, removing the photoresist layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate extension structure comprising a work function layer and a metal fill layer;
   a first source/drain feature and a second source/drain feature disposed over a substrate;
   a vertical stack of channel members disposed over the substrate and extending between the first source/drain feature and the second source/drain feature along a direction;
   a gate structure wrapping around each of the vertical stack of channel members; and
   an isolation structure extending along a sidewall of the gate extension structure,
   wherein the isolation structure comprises a fin spacer layer and a dielectric feature disposed over the fin spacer layer,
   wherein a portion of the fin spacer layer extends along a sidewall of the dielectric feature,
   wherein the work function layer in the gate extension structure is in direct contact with the first source/drain feature and the substrate.

2. The semiconductor device of claim 1, where the gate extension structure partially extends into the first source/drain feature along the direction.

3. The semiconductor device of claim 1, further comprising a plurality of inner spacer features disposed on surfaces of the first source/drain feature, wherein the plurality of inner spacer features comprise silicon nitride, silicon oxycarbonitride, silicon carbonitride, silicon oxide, silicon oxycarbide, silicon carbide, or silicon oxynitride.

4. The semiconductor device of claim 3, wherein the gate extension structure is in direct contact with the plurality of inner spacer features.

5. The semiconductor device of claim 3, wherein the first source/drain feature comprises an inner layer and an outer layer in direct contact with the inner layer, wherein the gate extension structure is in direct contact with the outer layer, wherein the gate extension structure is spaced apart from the inner layer by the outer layer and the plurality of inner spacer features.

6. The semiconductor device of claim 1, wherein the gate extension structure is disposed between the first source/drain feature and the isolation structure.

7. The semiconductor device of claim 1, wherein the fin spacer layer comprises silicon nitride, silicon oxynitride, silicon oxycarbonitride, or silicon carbonitride, wherein the dielectric feature comprises silicon oxide.

8. The semiconductor device of claim 1, wherein the gate extension structure is in contact with the fin spacer layer, wherein the gate extension structure is spaced apart from the dielectric feature.

9. A static random access memory (SRAM) cell, comprising:
a first pull-up multi-bridge-channel (MBC) transistor and a first pull-down MBC transistor coupled together to form a first inverter;
a second pull-up MBC transistor and a second pull-down MBC transistor coupled together to form a second inverter;
a first pass-gate MBC transistor coupled to an output of the first inverter and an input of the second inverter; and
a second pass-gate MBC transistor coupled to an output of the second inverter and an input of the first inverter,
wherein a first gate electrode of the first pull-down MBC transistor is in direct contact with a first source/drain feature of the second pull-up MBC transistor,
wherein a second gate electrode of the second pull-down MBC transistor is in direct contact with a second source/drain feature of the first pull-up MBC transistor.

10. The SRAM cell of claim 9, where the first gate electrode of the first pull-down MBC transistor partially extends into the first source/drain feature of the second pull-up MBC transistor.

11. The SRAM cell of claim 9, wherein the second pull-up MBC transistor further comprises a plurality of inner spacer features disposed on surfaces of the first source/drain feature of the second pull-up MBC transistor.

12. The SRAM cell of claim 11, wherein the first gate electrode of the first pull-down MBC transistor is in direct contact with the plurality of inner spacer features.

13. The SRAM cell of claim 11,
wherein the first source/drain feature of the second pull-up MBC transistor comprises an inner layer and an outer layer,
wherein the first gate electrode of the first pull-down MBC transistor is in direct contact with the outer layer,
wherein the first gate electrode of the first pull-down MBC transistor is spaced apart from the inner layer by the outer layer and the plurality of inner spacer features.

14. The SRAM cell of claim 11, further comprising:
an isolation structure extending along a sidewall of the first gate electrode,
wherein the first gate electrode is disposed between the first source/drain feature and the isolation structure.

15. A semiconductor structure, comprising:
a plurality of nanostructures;
a source/drain feature adjacent the plurality of nanostructures;
a gate structure wrapping around each of the plurality of nanostructures and extending along a first direction; and
a gate extension structure aligned with the gate structure along the first direction,
wherein the gate structure comprises an interfacial layer, a gate dielectric layer over the interfacial layer, a work function layer over the gate dielectric layer, and a metal fill layer over the work function layer,
wherein the gate extension structure shares the work function layer and the metal fill layer with the gate structure,
wherein the work function layer in the gate extension structure is in direct contact with the source/drain feature such that the gate extension structure is electrically coupled to the source/drain feature.

16. The semiconductor structure of claim 15, wherein the interfacial layer and the gate dielectric layer do not extend into the gate extension structure.

17. The semiconductor structure of claim 15, wherein the source/drain feature comprises an inner layer and an outer layer, wherein the gate extension structure is in direct contact with the outer layer but is spaced apart from the inner layer.

18. The semiconductor structure of claim 17, further comprising:
a plurality of inner spacer features disposed between the source/drain feature and the gate extension structure along a second direction perpendicular to the first direction,
wherein the gate extension structure is spaced apart from the inner layer by the plurality of inner spacer features.

19. The semiconductor structure of claim 15, wherein the work function layer comprises titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC).

* * * * *